(12) United States Patent
Maldonado et al.

(10) Patent No.: US 7,446,474 B2
(45) Date of Patent: Nov. 4, 2008

(54) HETERO-JUNCTION ELECTRON EMITTER WITH GROUP III NITRIDE AND ACTIVATED ALKALI HALIDE

(75) Inventors: Juan Ramon Maldonado, Palo Alto, CA (US); Francisco J. Machuca, San Francisco, CA (US); Steven T. Coyle, Alameda, CA (US)

(73) Assignee: Applied Materials, Inc., Santa Clara, CA (US)

( * ) Notice: Subject to any disclaimer, the term of this patent is extended or adjusted under 35 U.S.C. 154(b) by 518 days.

(21) Appl. No.: 11/090,094

(22) Filed: Mar. 25, 2005

(65) Prior Publication Data

US 2006/0055321 A1    Mar. 16, 2006

Related U.S. Application Data

(63) Continuation-in-part of application No. 10/697,715, filed on Oct. 29, 2003, now Pat. No. 7,015,467, which is a continuation of application No. 10/282,324, filed on Oct. 10, 2002, now Pat. No. 7,161,162.

(51) Int. Cl.
    *H01J 40/06* (2006.01)
(52) U.S. Cl. .................................. 313/542; 313/541
(58) Field of Classification Search .............. 313/527, 313/530, 532, 541, 542
    See application file for complete search history.

(56) References Cited

U.S. PATENT DOCUMENTS

| | | | |
|---|---|---|---|
| 3,631,303 A | 12/1971 | Antypas et al. | |
| 3,632,442 A | 1/1972 | Turnbull et al. | |
| 3,814,993 A | 6/1974 | Kennedy | |
| 3,884,539 A | 5/1975 | Sommer | |
| 3,895,234 A | 7/1975 | O'Keefe et al. | |
| 3,914,136 A | 10/1975 | Kressel | |
| 4,193,089 A | 3/1980 | Brougham et al. | |
| 4,287,230 A | 9/1981 | Galves et al. | |
| 4,311,939 A | 1/1982 | Faulkner et al. | |
| 4,390,789 A | 6/1983 | Smith et al. | |
| 4,398,118 A | 8/1983 | Galves et al. | |
| 4,608,332 A | 8/1986 | Ward | |
| 4,616,248 A | 10/1986 | Khan et al. | |
| 4,652,762 A | 3/1987 | Ward | |
| 4,694,178 A | 9/1987 | Harte | |
| 4,725,724 A | 2/1988 | van der Velden | |
| 4,820,927 A | 4/1989 | Langner et al. | |
| 4,914,136 A | 4/1990 | Drent et al. | |

(Continued)

OTHER PUBLICATIONS

Maldonado et al.; "Cs Halide Cathode for Multi-Electron Beam Pattern" Punlished by J. VAc. Sci. Technol. Nov, Dec. 2004.

(Continued)

*Primary Examiner*—Vip Patel
(74) *Attorney, Agent, or Firm*—Janah & Associates, P.C.

(57) ABSTRACT

A photocathode is capable of generating an electron beam from incident light. The photocathode comprises a light permeable support having a light receiving surface and an opposing surface. A Group III nitride layer is provided on the opposing surface of the support. The Group III nitride layer comprises at least one Group III element and nitrogen. An alkali halide layer is provided on the Group III nitride layer. The alkali halide can be a cesium halide, such as cesium bromide or iodide.

22 Claims, 14 Drawing Sheets

U.S. PATENT DOCUMENTS

| | | | |
|---|---|---|---|
| 4,950,952 | A | 8/1990 | Aramaki |
| 4,970,392 | A | 11/1990 | Oettinger et al. |
| 5,042,058 | A | 8/1991 | Rentzepis |
| 5,426,686 | A | 6/1995 | Rentzepis et al. |
| 5,430,292 | A | 7/1995 | Honjo et al. |
| 5,623,182 | A | 4/1997 | Okano et al. |
| 5,930,331 | A | 7/1999 | Rentzepis et al. |
| 5,982,094 | A | 11/1999 | Niigaki et al. |
| 5,986,263 | A | 11/1999 | Hiroi et al. |
| 6,172,365 | B1 | 1/2001 | Hiroi et al. |
| 6,184,526 | B1 | 2/2001 | Kohama et al. |
| 6,198,210 | B1 | 3/2001 | Kroon et al. |
| 6,259,094 | B1 | 7/2001 | Nagai et al. |
| 6,265,719 | B1 | 7/2001 | Yamazaki et al. |
| 6,303,918 | B1 | 10/2001 | Estrera et al. |
| 6,350,999 | B1 | 2/2002 | Uenoyama et al. |
| 6,476,401 | B1 | 11/2002 | Veneklasen et al. |
| 6,531,816 | B1 | 3/2003 | Breskin et al. |
| 6,538,368 | B1 | 3/2003 | Fox et al. |
| 6,577,058 | B2 | 6/2003 | Ossipov et al. |
| 6,580,215 | B2 | 6/2003 | Nihashi |
| 6,642,637 | B1 * | 11/2003 | Spallas et al. ............ 313/103 R |
| 2002/0015143 | A1 | 2/2002 | Yin et al. |
| 2002/0028399 | A1 | 3/2002 | Nakasuji et al. |
| 2002/0088940 | A1 | 7/2002 | Watanabe et al. |
| 2002/0100872 | A1 | 8/2002 | Hiroi et al. |
| 2003/0042434 | A1 | 3/2003 | Mankos et al. |
| 2003/0048427 | A1 | 3/2003 | Fernandez et al. |
| 2003/0066963 | A1 | 4/2003 | Parker et al. |
| 2003/0085355 | A1 | 5/2003 | Kohama |

OTHER PUBLICATIONS

Maldonado et al.; "A thin film p-type GaN Photocathode: Prospect for a high performance.." Thesis, Stanford University 2003.

U.S. Patent Application. entitled, "Electron Beam Pattern Generator With Photocathode Comprising Low Work Function Cesium Halide"; filed Oct. 10, 2002; U.S. Appl. No. 10/282,324; Inventors: Maldonado, et al.

Dinh et al., "Synthesis and characterization of Si/Cs/O nanocluster thin films with negative ion affinity" American Physical Society, 1999.

Kong et al. "Cesium telluride photocathodes," American Institute of Physics, 1995.

* cited by examiner

COMPUTER READABLE PROGRAM  555

- Image analysis instructions  557
  - Image database instructions  565
  - Image comparator instructions  567
  - Image processing instructions  569
- Deflection controller instructions  559
- Stage servo instructions  561
- Lens controller instructions  563

FIG. 16

HETERO-JUNCTION ELECTRON EMITTER WITH GROUP III NITRIDE AND ACTIVATED ALKALI HALIDE

CROSS REFERENCE

This application is a continuation-in-part of U.S. patent application Ser. No. 10/697,715, filed on Oct. 29, 2003 now U.S. Pat No. 7,015,467, entitled "GENERATING ELECTRONS WITH AN ACTIVATED PHOTOCATHODE", by Maldonado et al., which is a continuation-in-part of U.S. patent application Ser. No. 10/282,324, filed Oct. 10, 2002 now U.S. Pat No. 7,161,162, entitled "ELECTRON BEAM PATTERN GENERATOR WITH PHOTOCATHODE COMPRISING LOW WORK FUNCTION CESIUM HALIDE" also by Maldonado et al; both of which are incorporated herein by reference in their entirety.

GOVERNMENT SUPPORT

At least a portion of the work related to the invention described herein was performed with Government support under Contract Number N66001-03-C-8023 awarded by the Department of Defense (DARPA). The Government has certain rights in these portions of the invention.

BACKGROUND

Embodiments of the present invention relate to the generation of electron beams and their applications.

Electron beams are used in a number of different applications. For example, electron beams can be modulated and directed onto an electron sensitive resist on a workpiece, such as a semiconductor wafer or mask, to generate an electron pattern on the workpiece. Electron beams can also be used to inspect a workpiece by, for example, detecting electrons emerging or reflected from the workpiece, to detect defects, anomalies or undesirable objects. Electron beams can also be used to irradiate a workpiece, such as a postal envelope, to destroy toxic chemicals or harmful microorganisms therein.

A typical electron beam apparatus comprises an electron beam column that includes an electron beam source to generate one or more electron beams and electron beam elements to focus or deflect the electron beams across a workpiece, which is held on a movable support. The electron beam source typically comprises a photocathode and wavelength matched light beam source. The photocathode can be a light transparent workpiece coated with an electron emitter. The electron emitter has an electron work function, which is the minimum electron emission energy level required to emit an electron from the surface of the material. A beam source directs light onto the backside of the transparent workpiece, the light having an energy level that is at least as high as the electron work function. When photons of the beam impinge on the electron emitter they excite electrons to a suitable energy level that emits the electrons from the electron emitter.

One problem with such conventional electron beam apparatus arises from their throughput versus resolution trade-off. Conventional apparatus that use a single electron beam to scan across a workpiece provide relatively low throughput when used at high resolutions. For example, at current line width resolutions of 100 to 130 nm, a single electron beam system takes about 6 hours to scan across the entire surface of a 200 mm workpiece; however, at resolutions of 35 to 50 nm, the same system would take about 50 hours to scan the same workpiece. This problem is reduced in multiple electron beam apparatus, which use a plurality of electron beams drawn from one or more electron sources as separate and well-defined beams. The multi-beam systems provide higher throughput and speed even at high resolutions. However, even these multi-beam systems are limited by the degradation, low beam current and electron cross-over limitations of conventional photocathodes.

The electron emitters used in conventional photocathodes systems also have several limitations. For example, electron-emitting magnesium can gradually oxidize when exposed to residual oxygen in a low-pressure environment. MgO emitters often gives rise to deleterious blanking effects when the incident laser beam is blanked, i.e., turned on after an off period, when modulating the electron beams. In another example, the emission spot of a CsTe electron emitter often grows in size in operation, requiring the electron emitter to be patterned or covered with a protective anti-oxidation layer of CsBr, as described in commonly assigned U.S. patent application publication No. US 2003/0042434A1, which is incorporated herein by reference in its entirety. Cesium antimonide electron emitters may also have to be covered with a protective layer of CsBr to minimize attenuation of the quantum efficiency of the electron-emitting overtime in an oxygen environment, as described in U.S. Pat. No. 6,531,816 B1, which is also incorporated herein by reference in its entirety.

Some of these problems were solved using photocathodes that used an activated cesium halide electron emitter to generate electrons, as described in aforementioned U.S. patent application Ser. Nos. 10/697,715 and 10/282,324. However, such photocathodes although useful for device generations >35 nm, they provide a relatively low conversion efficiency (light to electron) for some mask writing applications. Increasing electron current by increasing laser power can cause radiation damage to the UV laser optical system and limit their lifetime. Therefore, higher conversion efficiency to produce higher electron current is desirable for many electron beam applications, such as in the writing of electron patterns on electron sensitive resist materials for <35 nm device generations.

Another type of electron emitter is made from a p-n junction type Group III to Group V nitride semiconductor material, such as indium aluminum gallium nitride. However, such electron emitting semiconductor materials often do not have good device stability or lifespan. Furthermore, the semiconductor material is typically coated with a low electron work function coating to achieve easier emission of electrons from the surface of the semiconductor. The low electron work function coating is typically not very stable in an oxygen atmosphere further reducing the stability of the photoemission device. Applying a protective coating over the exposed portion of the semiconductor material improves device stability but reduces photo yield since the protective coating often only serves to attenuate the electrons emitted from the semiconductor material.

Thus, it is desirable to have an electron generating system that can generate a consistent stream of electrons without deleterious changes during operation. It is further desirable to have a properly matched photocathode and beam source capable of generating electrons with good efficiency and consistent electron emission properties without degradation of the system optical components. It is also desirable to have a stable photocathode that does not degrade due to oxidation in the vacuum environment. It is further desirable to have an electron beam apparatus capable of providing good throughput at high resolutions.

SUMMARY

A photocathode is capable of generating an electron beam from incident light. The photocathode comprises a light permeable support having a light receiving surface and an opposing surface. A Group III nitride layer is on the opposing surface of the support, and comprises at least one Group III element and nitrogen. An activated alkali halide layer is provided on the Group III nitride layer. The alkali halide can be a cesium halide, such as cesium bromide or iodide.

The photocathode may be used in an electron beam pattern generator which also comprises a light source to generate the light directed onto the light receiving surface of the photocathode, electron optics to focus the electron emitted by the photocathode onto a substrate, and a substrate support to support the substrate. In one version, the light source may comprise a diode-pumped or argon-ion laser source and a BBO crystal to generate a laser beam, but other lasers can also be used.

A method of generating an electron pattern using the photocathode of claim 1 comprises directing light onto the light receiving surface of the support at a wavelength selected to cause electrons to be emitted from photocathode, modulating the light or emitted electrons according to a pattern to form modulated electron beams, and directing the modulated electron beams onto a substrate.

A method of manufacturing the photocathode comprises providing the light permeable support in a process zone and evacuating the process zone. A Group III nitride layer is deposited on the opposing surface of the support, the Group III nitride layer comprising at least one Group III element and nitrogen. An alkali halide is evaporated in the process zone to deposit an alkali halide layer on the Group III nitride layer. The alkali halide layer is activated by an energy source to generate a concentration gradient of alkali atoms in the layer.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

FIG. 16 is a schematic diagram of an embodiment of a computer-readable program suitable for operating the electron beam apparatus of FIG. 15.

DESCRIPTION

Figure 1A:
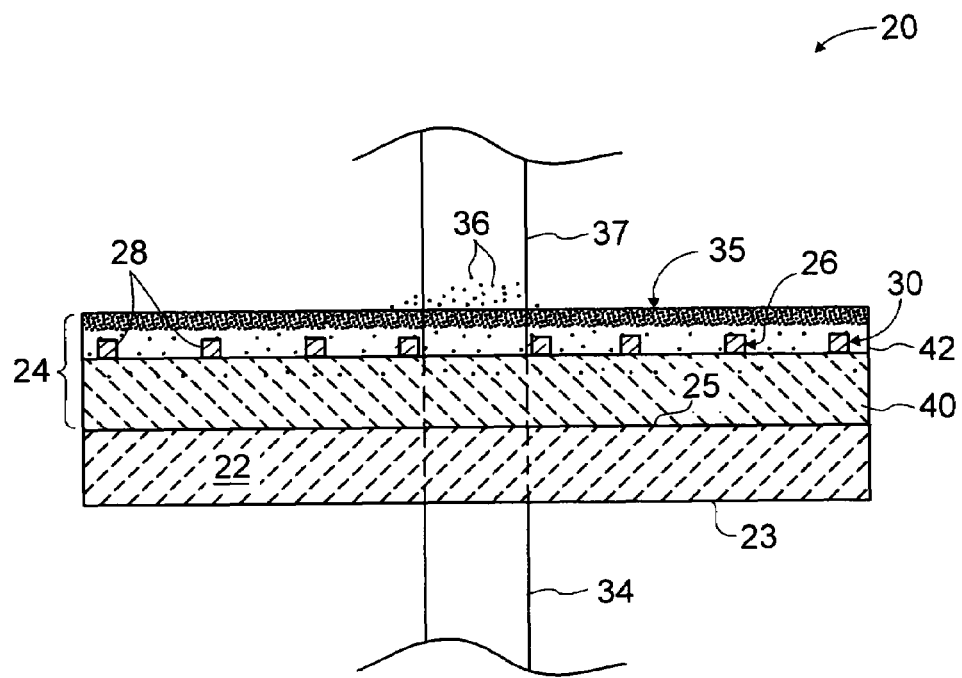
FIG. 1A is a sectional side view of a photocathode comprising a hetero-junction electron emission comprising a Group III nitride layer and an activated alkali halide layer.
Figure 1B:
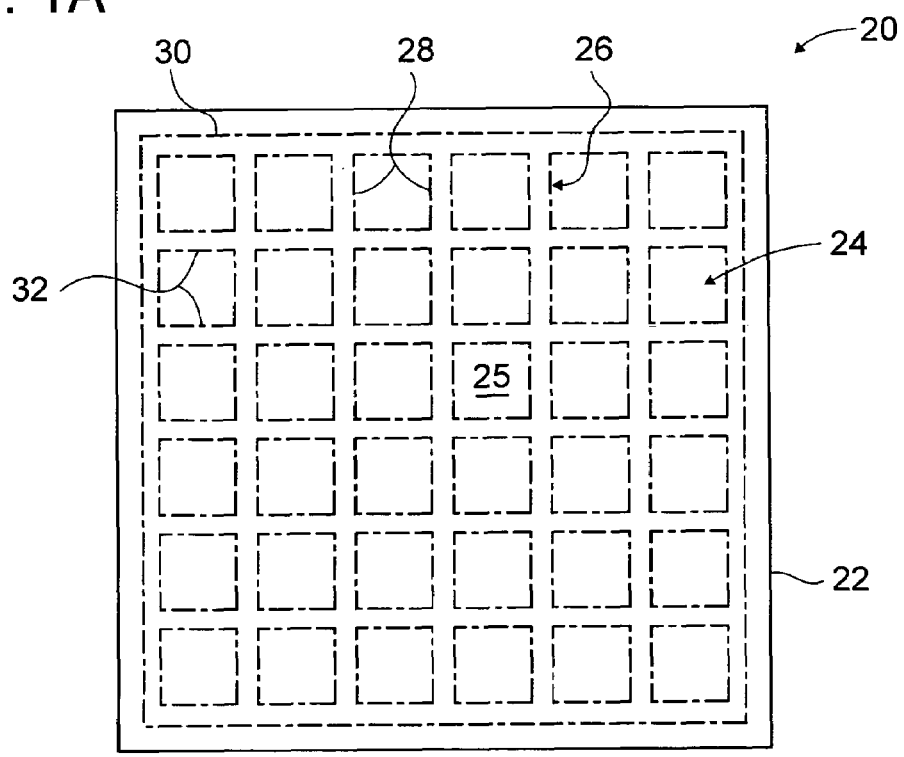
FIG. 1B is a top partial sectional view of the photocathode of FIG. 1A showing an embedded wire frame conductor.

A photocathode 20 capable of generating electrons comprises a light permeable support 22 that serves to support an electron emitter 24, as illustrated in FIGS. 1A and 1B. The light permeable support 22 has a light receiving surface 23 for receiving photons and an opposing surface 25 on which the electron emitter 24 is formed. In the transmission mode, the light permeable material is permeable to light in a predefined band of wavelengths to allow the light to pass through the support 22 to reach the electron emitter 24. For example, the support 22 may comprise aluminum oxide, such as sapphire, which is permeable to light having wavelengths in the visible, ultraviolet and infra-red ranges. Typically, the support 22 has a crystal structure that matches within about 5% the crystal structure of an overlying portion of the hetero-junction electron emitter 24 because an excessive difference in the dimensions of adjacent crystal lattices can result in lattice strain. Other limits are imposed by opacity, poor heat capacity, and the need in some materials for thick layers to absorb photons. The support 22 can also be formed of other materials such as for example, fused silica, quartz, diamond or SiC.

While an illustrative embodiment of the photocathode 20 is described, it should be understood that other embodiments are also possible, such as embodiments in which other forms of radiation than light are used to excite electrons from the photocathode 20, embodiments in which there is no support 22 and the photocathode 20 is made entirely from a electron emitter 24 comprising electron emitting material, or still other embodiments which have different shapes or which use different layers; thus, the scope of the claims should not be limited to the illustrative embodiments.

During use, the photocathode 20 is typically maintained at a negative bias but may also be maintained at a floating or ground potential. The photocathode 20 has a conductor 26 that serves as the negatively biased electrode to complete the photocurrent circuit. In the version shown, the conductor 26 is a wire grid 28 that is positioned within the electron emitter 24. The wire grid 28 can comprise a wire frame 30 that extends around the circumference of the hetero-junction electron emitter 24. The wire frame 30 can also include a wire mesh 32 covering the space enclosed by the wire frame, as shown in FIG. 1B. The wire mesh 32 is typically made from an electrically conducting metal that may also provide good adhesion and low chemical reactivity with the other materials within the hetero-junction electron emitter 24 and the support 22. Suitable conducting metals include Pt, Ni, Mo, Cr and Ta, W and alloys with Au of these elements.

The electron emitter 24 absorbs photons from an incident light beam 34 causing electrons to be excited to energy levels that are above the energy level required to escape to the surrounding vacuum environment. At least a portion of the electrons 36 that are sufficiently excited are emitted from the exposed electron emission surface 35 of the electron emitter 24 into the vacuum to form an electron beam 37. The electron emitter 24 has a minimum electron emission energy level that is sufficiently low to emit electrons when photons having energy levels greater than the minimum electron emission energy level are incident upon and absorbed by the hetero-junction electron emitter 24. The electron emitter surface 35 can also be patterned to control the size of the electron emission regions between the grid pattern, for example, the wire grid 28 can serve as the grid pattern.

In one version, the electron emitter 24 is hetero-junction and comprises at least (i) a Group III nitride layer 40 deposited on the opposing surface 25 of the support 22, and (ii) an alkali halide layer 42 on the Group III nitride layer 40. In the transmission mode light passes through support 22 creating photoelectrons in active Group III nitride layer 40, and these electrons are accelerated through the alkali halide layer 42 to exit the photocathode surface 35 into the vacuum environment. The Group III nitride layer 40 comprises at least two elements, which include one Group III element and elemental nitrogen. Group III consists of two subgroups: Group IIIa consisting of scandium, yttrium, and lanthanium, which is generally considered with the lanthanoids, and actinium, which is classified with the actinoids; and Group IIIb which comprises boron, aluminium, gallium, indium, and thallium. Preferably, the Group III element includes, for example, scandium, yttrium, lanthanum, actinium, boron, aluminum, gallium, indium and thallium. The Group III nitride layer 40 can be a single nitride compound comprising at least two elements, or more typically comprises at least three elements, including two or more Group III elements with nitrogen. The Group III nitride layer 40 can be a stoichiometric compound or a non-stoichiometric compound.

The Group III nitride layer 40 can be tailored to provide a desired bandgap level by controlling the relative amounts of Group III and nitrogen elements in the crystalline layer. The band gap level and requisite composition of the material can be selected depending on the wavelength of absorption desired, which can depend upon the wavelength of radiation that is incident on the photocathode. The compound's bandgap results from the difference between the energy of the electrons in its filled valence band and the energy electrons would need to occupy its empty conduction band. Doping the compound provides extra electrons or positively charged "holes" in the bandgap that can carry a current. Photons having a wavelength corresponding to the energy level required to excite an electron to the desired bandgap create electron-hole pairs and lets an electron current flow across the junction between positively and negatively doped layers.

In one version, the Group III nitride layer 40 is composed of indium gallium nitride. The indium gallium nitride can be tailored to provide a desired bandgap level by controlling the relative amounts of indium and gallium in the crystalline layer. The bandgap width of indium gallium nitride increases smoothly and continuously from 0.7 eV as the proportions shift away from indium in favor of gallium, until reaching the well-established value of 3.4 eV for simple gallium nitride. In the present example, a suitable proportion of indium, gallium and nitrogen, comprises $In_x Ga_{1-x} N_1$ where x<=30%. This stoichiometry is preferred to minimize bulk oxidation. Usually InGaN is p-type heavily doped (>10E18 holes/cm3) with Mg.

The alkali halide layer 42 superimposed on the Group III nitride layer 40 is composed of an activated alkali halide that emits electrons when excited with light having a minimum electron emission energy level higher than the minimum electron emission energy level of the un-activated material. The alkali metals, found in Group I of the periodic table (formerly known as group IA), are reactive metals that have only one electron in their outer shell, and can lose that one electron in ionic bonding with other elements. The alkali metals include lithium, sodium, potassium, rubidium, cesium and francium. The halogens of Group VII of the periodic table include chlorine, fluorine, bromine and iodine. The alkali halide layer 42 comprises at least one alkali metal and at least one halogen in a ratio that may be a stochiometric or non-stoichiometric ratio. In one version, the alkali halide layer 42 comprises a cesium halide layer which comprises at least one cesium atom and at least one halogen atom. For example, the cesium halide layer 42 can be CsBr or CsI. The cesium halide layer is not necessarily limited to particular stoichiometric formulations of conventional cesium halides, but can include non-stochiometric formulations that provide a desirable minimum electron emission energy level. In addition, the cesium halide material can also contain other materials, beside cesium and halogen.

The alkali halide layer 42 has to be activated before it can emit electrons at the desired efficiency and yield levels, and to have a lower minimum electron emission energy level than the theoretical minimum electron emission energy of the same but untreated alkali halide material. The activation treatment reduces the minimum electron emission energy level of the alkali halide by at least 75%, and can even lower the energy level by at least 50%. For example, without activation, the theoretically determined energy gap of an exemplary alkali halide such as CsBr is 7.8 eV, however, after activation the minimum emission energy of the same CsBr material can be reduced to less than about 5 eV, for example, about 4.8 eV, and can even be about 3 eV. The significantly lower minimum electron emission energy level makes it practicable to use the hetero-junction electron emitter in conventional applications.

In one version of the activation method, the alkali halide layer 42 is activated by irradiating the layer with a light having a sufficiently high energy level and for a sufficiently long time period to create an activated material having a lower minimum electron emission energy level. The light may be, for example, UV, X-ray, visible light, or electron beams. During irradiation, it is believed that a lower minimum electron emission energy level is achieved by the migration of alkali metal atoms from the interior region of the layer 42 to the surface 35 of the electron emitter 24 to form color centers in the bulk of the alkali halide material and a capping layer on its surface. A color center (or F-center) is a lattice defect in a crystalline solid comprising a vacant negative ion site and an electron bound to the site. Such defects absorb light having a wavelength that corresponds to the band gap energy level created by the defect, and can make certain normally transparent crystals appear colored, or can make colored crystals change color. The color centers and their corresponding light absorption bands may be caused by one or more of hole center, electron centers, di-vacancy and di-hole centers, and even Frenkel defects. The presence of the color centers can be detected by observing a change in a color of the material, if such a color change is in the observable visible spectrum. Scanning a series of sequentially incremented wavelengths across a specimen of the activated material and detecting the resultant absorption spectrum can be used to detect the color centers. The detected absorption spectrum has absorption peaks corresponding to the wavelengths of the incident light that is absorbed by the color centers. Thus, the un-activated alkali halide absorbs a first level of a light having a wavelength that falls in the absorption band of color centers to form the activated alkali halide, which then absorbs a second level of the same light to emit electrons. Photoelectron spectroscopy can also be used to probe the electronically excited states of alkali-halide material with excess electrons, in which the excess electrons are pumped up to their excited states by one laser pulse before being driven into the continuum by a second laser pulse.

Activation of the alkali halide layer 42 by irradiating with light is enhanced when the alkali halide material is simultaneously heated to a temperature of from about 60 to about 300° C. At the relatively low temperatures of less than about 100° C., the heat increases the diffusion of alkali metal atoms, such as the cesium, to the surface of the alkali halide film to form a capping surface layer having a higher concentration of alkali atoms than that present in the bulk of the interior region of the activated material. However, the material can be deactivated when it is heated to a sufficiently high temperature. The higher surface concentration of alkali metal atoms in the surface reduces the effective work function of the alkali halide layer 42 by lowering the energy required to excite electrons out of the surface. Typically without external heating, directing a laser beam having an output of a few mWatts for a time period of a few hours, such as about 180 minutes (3 hours), on the layer 42 is sufficient to generate the surface activating capping layer.

In the activation process, the incident light causes the alkali metal atoms, such as the cesium atoms, to migrate to the surface of the hetero-junction electron emitter 24 to form a thin capping layer having a higher concentration of alkali metal than the surrounding bulk material. The capping layer can have a thickness from at least a fraction of a monolayer to several monolayers of atoms. It is believed that the capping surface layer of alkali metal cooperates with the underlying bulk of the alkali halide material to form a dipole that reduces the electron emission energy at the surface of the resultant hetero-junction electron emitter 24.

For example, in an alkali halide layer 42 comprising cesium halide, the cesium halide material is deposited as a layer on a support and then activated to have a capping layer on its surface. When photons irradiate the layer 42, the emission surface 35 with the higher cesium concentration of the capping layer provides an effectively lowered minimum electron emission energy level at the surface 35 that allows longer-wavelength (lower energy) photons to generate electron emission from the activated material. For example, by deep-UV light activation, the minimum electron emission energy level at the emission surface 35 with the underlying cesium bromide or cesium iodide layer can be reduced to less than 5 eV, such as about 4.8 eV or 3.6 eV or even about 2.1 eV. Then, a photon beam 34 such as an argon-ion laser beam with a wavelength of at least about 257 nm, such as for example, a wavelength of about 364 or 532 nm, can be used to irradiate and cause electron emissions from the hetero-junction electron emitter 42. The photoyield of the 532 nm laser beam is significantly lower than the corresponding one for the smaller-wavelength laser beam, such as the 257 nm laser beam.

In one version, the alkali halide layer 42 comprises activated cesium bromide material. This activated cesium bromide material can yield a quantum efficiency of at least about 0.1% when irradiated with approximately 4.8 eV photons (257 nm), and an energy spread of about 1 eV. This version is advantageous because conventional photoemitters like Au have a much lower efficiency and are susceptible to surface contamination. In another version, layer 42 comprises cesium iodide material. The cesium iodide material is advantageous because it may be more stable in terms of temperature resistance or corrosion resistance.

The hetero-junction electron emitter 24 provides unique advantages because the activated alkali halide layer 42 provides high output sensitivity with photoyields that exhibit low degradation over time in a vacuum environment. The sensitivity and photoyields are measures of the electron emitting efficiency of the hetero-junction electron emitter layers 24. An activated alkali halide, for example, activated CsBr, provides a photoemission electron yield at least about 20 nA/mW, and more typically, even about 200 nA/mW. In contrast, the same un-activated CsBr photocathode generally provides no yields or yields of less than about 2 nA/mW. This demonstrates an improvement in yield of a factor of 10 to about 100 times.

Furthermore, unlike conventional photocathode materials, the hetero-junction electron emitter 24 provides electron yields that reduce only marginally after operation for extended periods in vacuum environments. For example, a hetero-junction electron emitter 24 having an activated CsBr hetero-junction electron emitter 42 with an argon ion laser can provide a photoyield of greater than 200 nA/mW that remains stable at these levels in a vacuum environment for an extended time period of more than 150 hours without appreciable degradation.

Another advantage is that the Group III nitride layer 40 provides good temperature resistance and have high breakdown voltages. For example, InGaN is a refractory material from the group III-nitrides, having breakdown voltages that can exceed 1 Mega-Volt per cm. InGaN also supports light sources such as lasers having power densities in the range of 0.1 to 1 Mega-Watt per cm sq. This results in much higher electron current densities from the hetero-junction electron emitter 24.

The lower minimum electron emission energy level of the activated material also allows use of activated beam sources that are well characterized and commonly used systems, such as an argon ion laser. An argon ion laser has a fundamental wavelength of at least about 514 nm, which can be frequency multiplied by the BBO crystal to have a divided wavelength of at least about 257 nm. The divided wavelength is equivalent to an energy level of about 4.8 eV, which is higher than the minimum electron emission energy level of activated CsBr of about 2 eV. The same argon ion laser cannot be used to generate electrons using un-activated CsBr, which in its untreated form has an energy gap of 7.8 eV that would require a laser source having a wavelength smaller than 158 nm, which is smalller than that being produced by the argon ion laser. For these reasons, activated layer 24 comprising CsBr, emits electrons more reliably and with better yields than the un-activated material.

Figure 2:
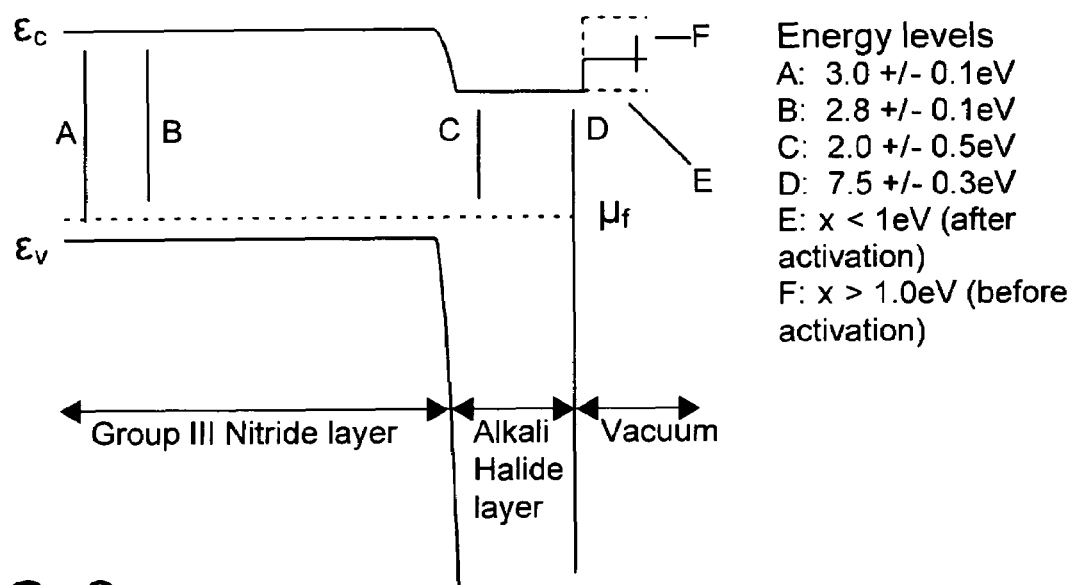
FIG. 2 is a proposed energy band diagram of a hetero-junction electron emitter comprising indium gallium nitride and activated cesium bromide (InGaN/CsBr)

An idealized energy band diagram of a hetero-junction electron emitter 24 comprising a hetero-junction emitter composed of a Group III nitride layer 40 comprising an indium gallium nitride layer, and an alkali halide layer 42 composed of an activated cesium bromide layer, is shown in FIG. 2. This diagram shows the lower electron affinity "F" after laser activation of the alkali halide layer 42 with a laser operated at a wavelength of 257 nm. It is believed that the lower activation energy results from the creation of color centers that align the Fermi levels of the two layers 40, 42, of the electron emitter 24, or some other defect density lying within the upper portion of the alkali halide bandgap and within 2 to 3 eV of the conduction band edge. The photoelectrons created within the Group III nitride layer 40 are accelerated through the activated alkali halide layer 42, and easily exit the surface 35 of the hetero-junction electron emitter 24 with energies above the vacuum barrier at the emitting surface. After activation, the operational wavelength can be tuned towards longer more practical wavelengths set by the absorption properties of the underlying Group II nitride layer 40 such as the wavelengths of 300 to 400 nm. This is done by changing the mole fraction of Indium in the material.

Figure 3:
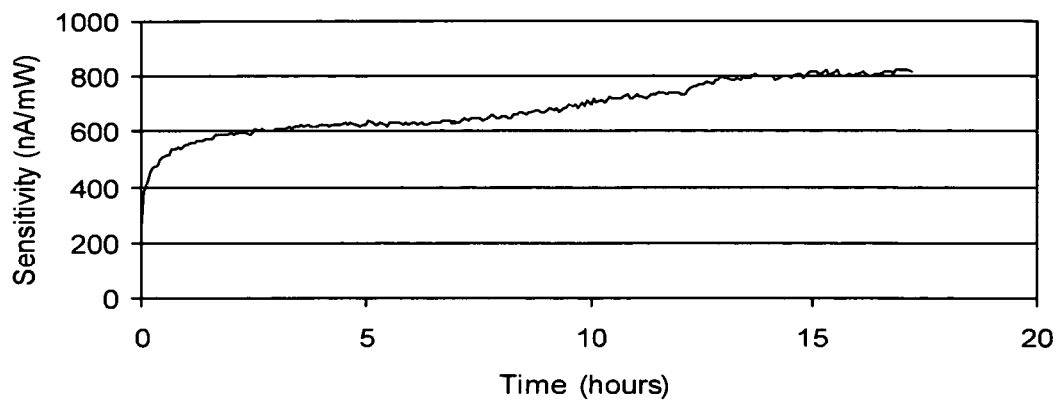
FIG. 3 is a graph showing the sensitivity of an InGaN/CsBr hetero-junction electron emitter with exposure to a laser having a wavelength of 257 nm.

FIG. 3 is a graph showing the high levels of output sensitivity of a hetero-junction electron emitter 24 comprising a Group III nitride layer 40 composed of indium gallium nitride layer, and an alkali halide layer 42 composed of an activated cesium bromide layer. In this version, the alkali halide layer 42 was activated by exposure to a laser having a wavelength of 257 nm at power level of 4 mW power and a spot size of 1.25 to 1.5 μm. Activation of the alkali halide layer 42 with the 257 nm wavelength light required approximately 0.1 MW/cm$^2$ of laser power. The current density extracted was greater than about 200 A/cm$^2$, which is roughly 2 to 4 times larger than CsBr layer alone on a metallic substrate which was absent the Group III nitride layer 40. The output sensitivity was seen to fluctuate with changes in laser power and subsequent changes in laser spot position on the photocathode 20. Thus, the rise and fall in photoyield registers the varying degrees of activation of the alkali halide layer 42 across the surface over distances of microns from the original spot.

Figure 4:
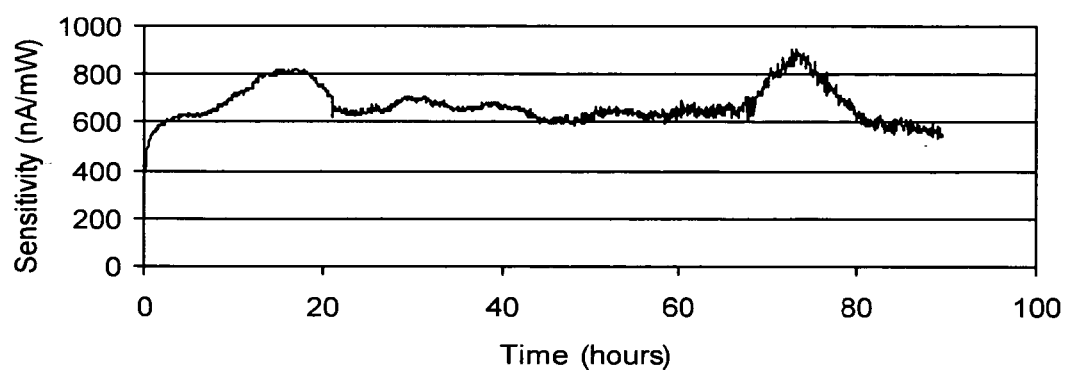
FIG. 4 is a graph showing the change in sensitivity of an InGaN/CsBr hetero-junction electron emitter with time of operation.

The change in output sensitivity of the same hetero-junction electron emitter 24 during an extended time of operation is shown in FIG. 4. In this graph, a laser beam incident on the electron emitter was applied at a wavelength of 257 nm, 4 mW±1 mW power, and with a 1 micron beam size. The output of the hetero-junction electron emitter 24 over time remained substantially constant varying only from between 600 and 800 nA/mW, nominally; the small changes shown in the graph probably being due to movement of the incident laser beam spot on the light receiving surface 23 of the photocathode 20. This demonstrates the consistent output of this photocathode 20 over time and that the photocathode 20 is not adversely affected by the environment, thermal degradation or other types of deterioration.

Figure 5:
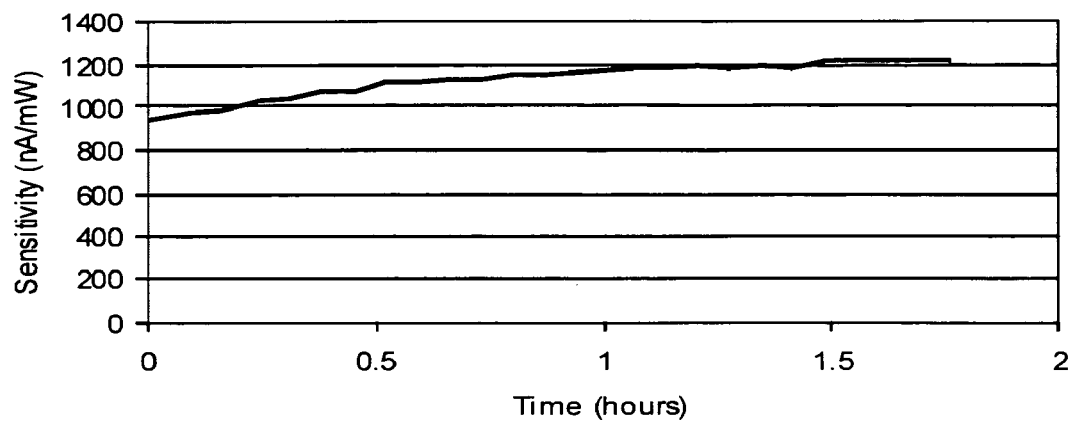
FIG. 5 is a graph showing the initial activation sensitivity of an InGaN/CsBr hetero-junction electron emitter with exposure to a laser having a wavelength of 257 nm.
Figure 6:
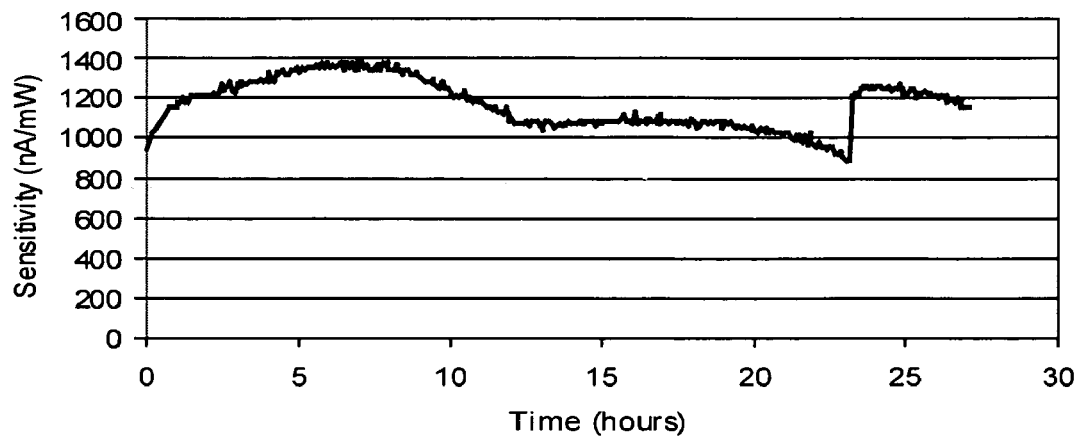
FIG. 6 is a graph showing the sensitivity over time of operation for an InGaN/CsBr hetero-junction electron emitter extracting >1000 A/cm$^2$ with exposure to a laser having a wavelength of 257 nm.

The high sensitivity of the same hetero-junction electron emitter 24 is shown in FIG. 5. The photocathode 20 was exposed to a laser having a wavelength of 257 nm, a 1.25 to 1.5 μm spot size, and a power level of 7 mW. The hetero-junction electron emitter 24 composed of InGaN/CsBr extracted a high current density of greater than about 1000 A/cm$^2$ at 257 nm illumination. The higher current density is advantageous because it facilitates high throughput e-beam tools. The hetero-junction electron emitter 24 provides a higher current density because of the large absorption within InGaN and the device low energy barrier to the vacuum level. The sensitivity over time of operation for the hetero-junction electron emitter composed of InGaN/CsBr, which extracts >1000 A/cm$^2$ with exposure to a laser having a wavelength of 257 nm, at a power of 7 mW, and a beam size of 1 μm, is shown in FIG. 6. Again the sensitivity showed only fluctuations arising from movement of the light beam 34, but was still relatively steady varying from about 900 to about 1400 nA/mW.

Figure 7:
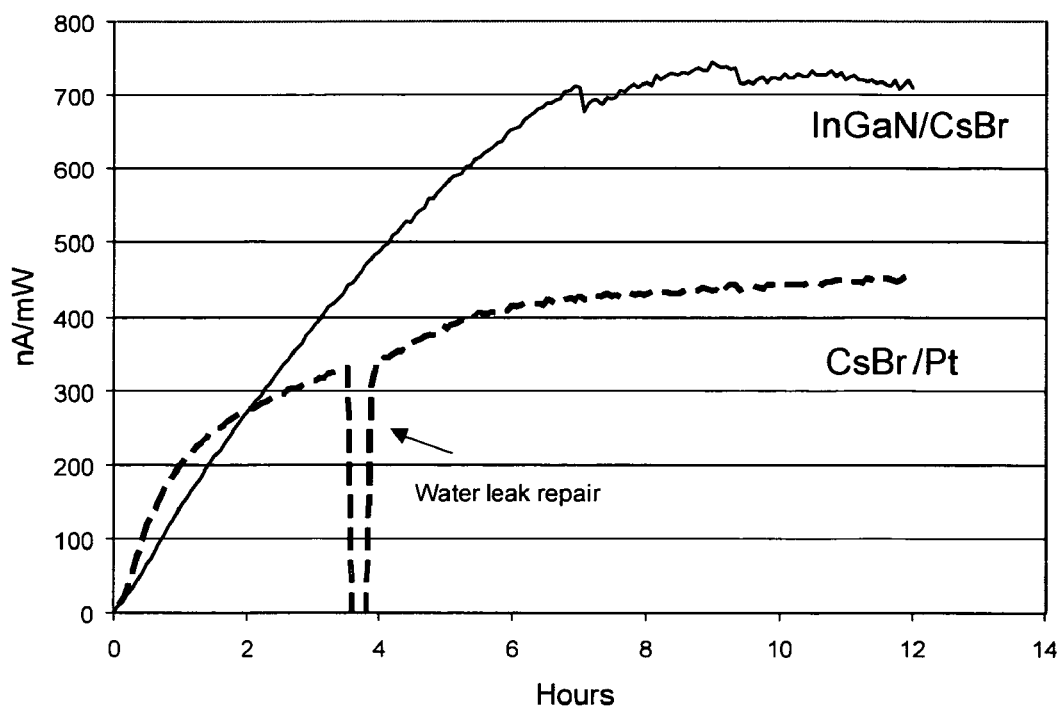
FIG. 7 is a graph showing the comparative photo yield at low power density obtained in the reflection mode for a InGaN/CsBr hetero-junction electron emitter and a single CsBr film deposited on a Pt substrate.

The comparative photo yield at low power density obtained for a hetero-junction electron emitter 24 composed of InGaN/CsBr, as compared to a electron emitter composed of activated alkali halide (CsBr) on a Pt substrate is shown in FIG. 7. The sensitivity of the hetero-junction electron emitter 24, as measured in electron current per unit laser watt power, was much higher than the electron emitter comprising only the activated alkali halide, demonstrating the good properties of the combination of material layers for the electron emitter 24. The output sensitivity increased by at least 50% and even by at least about 75%. In this graph, a laser beam incident on the electron emitter was applied at a wavelength of 257 nm, 52 mW power, and with a 1 mm diameter beam and a −750 V bias.

Figure 8:
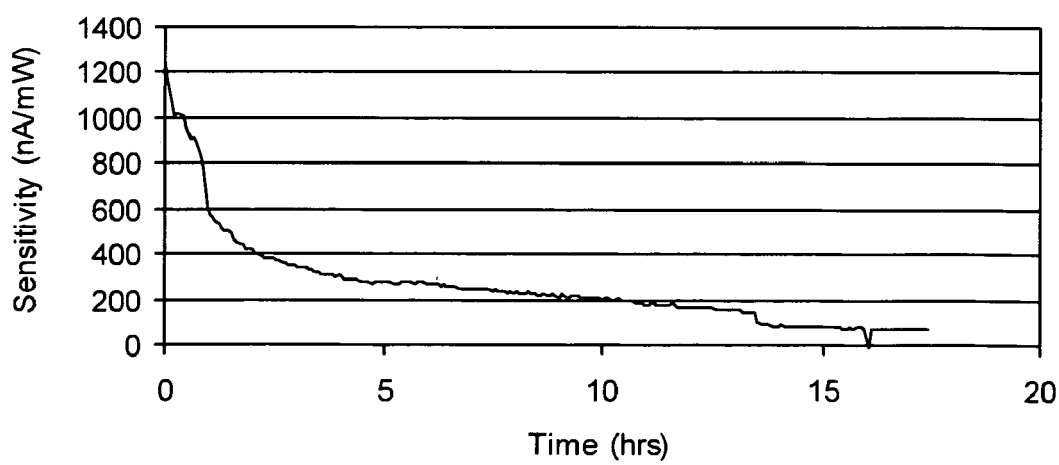
FIG. 8 is a graph showing the decreasing sensitivity of an InGaN/Pt photoemission bilayer after several hours.

The graphs of FIG. 4 and FIG. 6 demonstrated the good and substantially constant output sensitivity of a hetero-junction electron emitter 24 composed of InGaN/CsB during an extended time of operation at different laser beam power levels, with only minor fluctuations arising from movement of the light beam 34. In comparison, FIG. 8 shows the sensitivity of a conventional electron emitter comprising a photo-emission bilayer composed of InGaN on a platinum support shows an output sensitivity which gradually decreases from 1200 to 200 nA/mW, and even less than that, over a time of 15 hours. In this graph, a laser beam incident on the electron emitter was applied at a wavelength of 364 nm, 3 mW power, and with a 6 mm diameter beam and a −280 V bias between photocathode and collection electrode. The wavelength of 364 nm and the low power level of 3 mW provides better performance in InGaN photocathodes than high power density 257 nm operation.

The hetero-junction electron emitter 24 of the photocathode 20 can be manufactured by a number of different methods as would be obvious to one of ordinary skill in the art, including fopr example but not limited to, various combinations of processes such as molecular beam epitaxy (MBE), metalloorganic chemical vapor deposition (MOCVD), chemical vapor deposition (CVD), physical vapor deposition (PVD), oxidation, nitridation, and other processes. Typically, the light permeable support 22, such as a sapphire plate, is initially cleaned of impurities and contaminants by chemical and thermal cleaning. For example, the substrate can be heated to for example, 70° C., in a bath of 90% concentration sulfuric acid. The substrate can also be cleaned by other conventional ways to remove organics, residual carbon, and surface impurities. For example, plasma cleaning in a low pressure environment of oxygen maintained at a few mTorr, for example, about 50 mTorr.

Thereafter, in a first step, a Group III nitride semiconductor layer 40 is grown on the cleaned support 22. The Group III nitride semiconductor layer 40 can be grown by conventional methods that include molecular beam epitaxy (MBE) which encompasses Elemental Source MBE (ESMBE) and intermediate MBE methods that involve the substitution of hydrides or simple organometallic compounds for the elemental sources of conventional MBE methods; and even metallorganic chemical vapor deposition (MOCVD). In one version, a Group III nitride semiconductor layer 40 comprising InGaN is grown on the cleaning support 22 by molecular beam epitaxy (MBE).

Optionally, a back diffusion barrier layer (not shown) is initially deposited on the cleaned support 22 to prevent back diffusion of the subsequent material being deposited on the substrate, also by MBE. For example, a typical back diffusion barrier layer comprises AlN buffer layer having a thickness of 500 Å. The layer is kept thin to limit attenuation of the incident photons. Thereafter, an MBE process is conducted to deposit successive single crystal layers having a wurtzite-type structure of InGaN, each of which are from about 0.1 μm to about 1 μm thick. The InGaN layer is doped during the MBE process with Mg to make it a p-type layer having an Mg concentration of $1 \times 10^{18}$ cm$^{-3}$. These films can all be grown by MBE grown on a c-axis double side polished sapphire substrate, without any anti-reflection coating (approximately 200 um thick, 21 mm diameter). The Indium mole fraction was estimated to be 10% which theoretically decreases the band gap from 3.4 eV of GaN to 2.9+/−0.2 eV. Cathodal luminescence measurements verified the in mole fraction to be slightly lower than 10% (expecting closer to 3.0 eV gap). In addition, a four point probe measurement measured a 6 ohm-cm conductivity for the p-type film to further characterize the film.

In a typical MBE system, the individual elements of a compound semiconductor or other material in the form of individual molecular beams are deposited onto a heated crystalline substrate to form thin epitaxial layers. The molecular beams are typically formed by thermally evaporation of elemental sources, such as powdered elemental material, for example, separate powders of indium and gallium nitride, can be used to deposit InGaN. However, other sources including metal-organic group III precursors (MOMBE), gaseous group V hydride or organic precursors (gas-source MBE), or their combinations (chemical beam epitaxy or CBE), can also be used. To obtain high-purity layers, it is critical that the material sources be extremely pure and that the entire process be done in an ultra-high vacuum environment. Another important feature is that growth rates are typically on the order of a few Å/sec and the molecular beams can be shuttered off from the growth chamber in a fraction of a second, allowing atomic transitions from one growth layer to another.

Figure 9A:
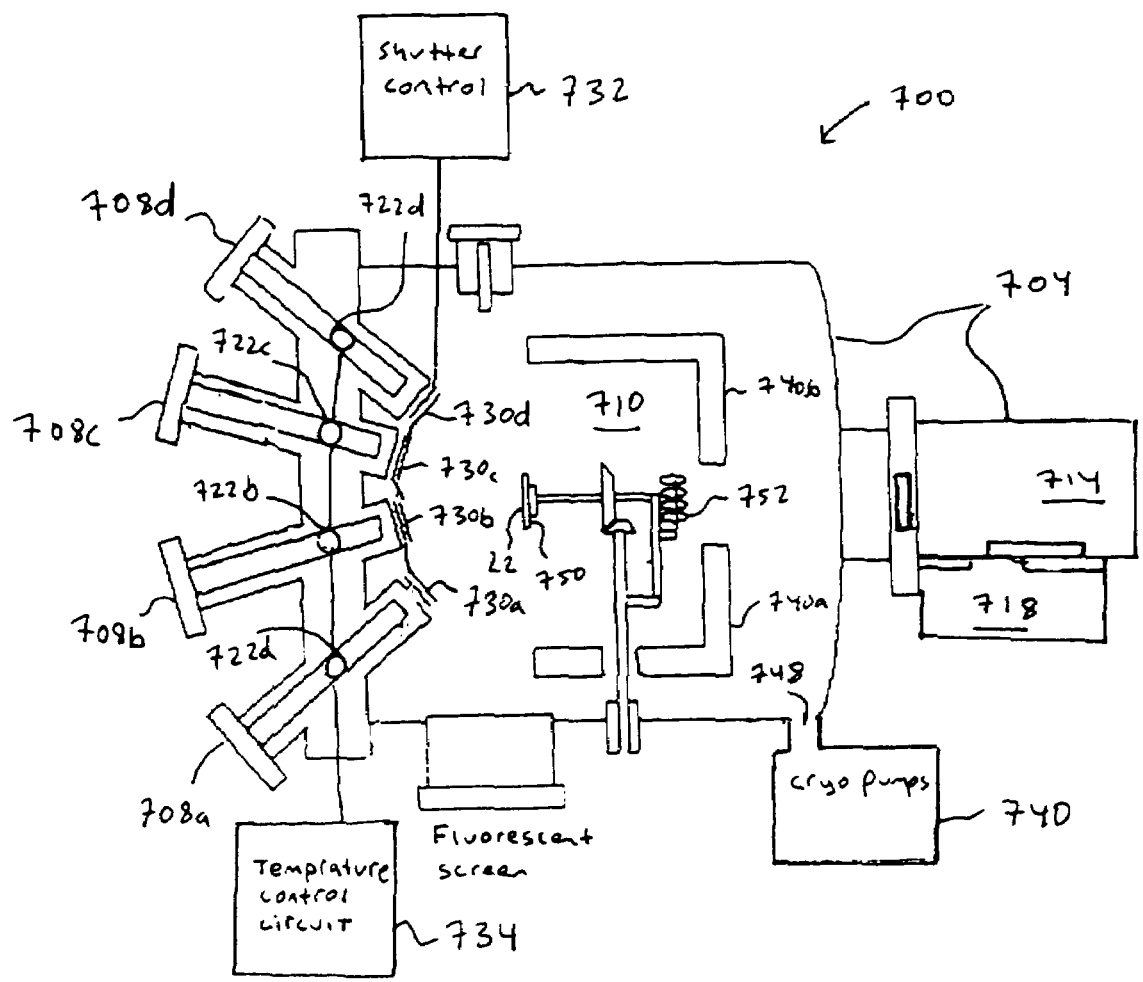
FIG. 9A is a schematic diagram of a typical MBE vacuum system comprising effusion cells, a growth chamber, buffer chamber, and a load lock.

A typical MBE vacuum system 700 comprises interconnected chambers 704 that can include, for example, effusion cells 708a-d, a growth chamber 710, buffer chamber 714, and a load lock 718, an exemplary MBE system being shown in FIG. 9A. The load lock 718 is used to bring samples into and out of the vacuum environment while maintaining the vacuum integrity of the other chambers 704. The buffer chamber 714 is used for preparation and storage of samples and can also act as a transition point to allow samples to be transferred under vacuum to different growth chambers 704. Material sources 722a-d that can each contain an elemental or compound material in powder form which is to be evaporated, are in individual effusions cells 708a-d, respectively. Each effusion cell 708a-d has an independently controllable shutter 730a-d, which is controlled by a shutter control 732, to regulate the flux of evaporated material that is outputted from the cell into the growth chamber 710. The effusion cells 708a-d are independently heated until the material in the cell fluxes to temperatures as small as 0.5° C. to precisely control flux changes, and thus, control deposition film thickness. A temperature control circuit 734 with stable control loops using with Tungsten-Rhenium thermocouples and proportion, integral, and derivative (PID) controllers is used to control the temperatures of the effusion cells 708a-d.

In the growth chamber 710 of the MBE system 700, the substrate holder 750 is used to hold the substrate 22 which is typically heated. The substrate holder 750 and other heated parts are made of materials such as Ta, Mo, and pyrolytic boron nitride (PBN) which do not decompose or outgas impurities even when heated to 1400° C. The sample holder 750 faces the effusion cells 708a-d and provides continual azimuthal rotation of the substrate 22 to improve deposition film uniformity.

The entire MBE vacuum chamber 700 is maintained at an ultra low vacuum pressure of less than about $\sim 10^{-11}$ Torr, through the use of the cryopanels 740a,b that each comprise liquid nitrogen cooled cryoshrouds and one or more cryopumps 744 that exhaust gases from a port 748 in the chamber. Pumping keeps the partial pressure of undesired gasses, such as $H_2O$, $CO_2$, and CO to a minimum. Pressure in the growth camber 710 can be monitored using an ion gauge 752. To monitor the residual gasses, analyze the source beams, and check for leaks, a quadrupole mass spectrometer (QMS) (not shown) can be used.

An electron beam evaporator 57 evaporates a metal or metal compound which deposits on the support 22 to form a conducting film that may be subsequently etched to form the pattern of the conductor 26. For example, the conductor 26 can be made from a platinum film deposited on the surface of the Group III nitride semiconductor layer 40, for example, the InGaN material. A platinum metal film deposited to a thickness of less than about 100 nm. The evaporator 57 can operate by directing a beam of electrons onto a metal wire comprising the selected metal. The conductor 26 can also be made of other metals, such as Mo, Cr and Ta, W and alloys with Au of these elements. Generally, but not necessarily, the conductor material is selected to have good conductivity, good surface wetting characteristics, and strong adhesion. The conductor 26 can also be formed by PVD of a metal material onto the support 22. After a conducting film of material is deposited, the conducting film is etched to form a pattern of conducting lines, for example to form the wire mesh 30.

Figure 9B:
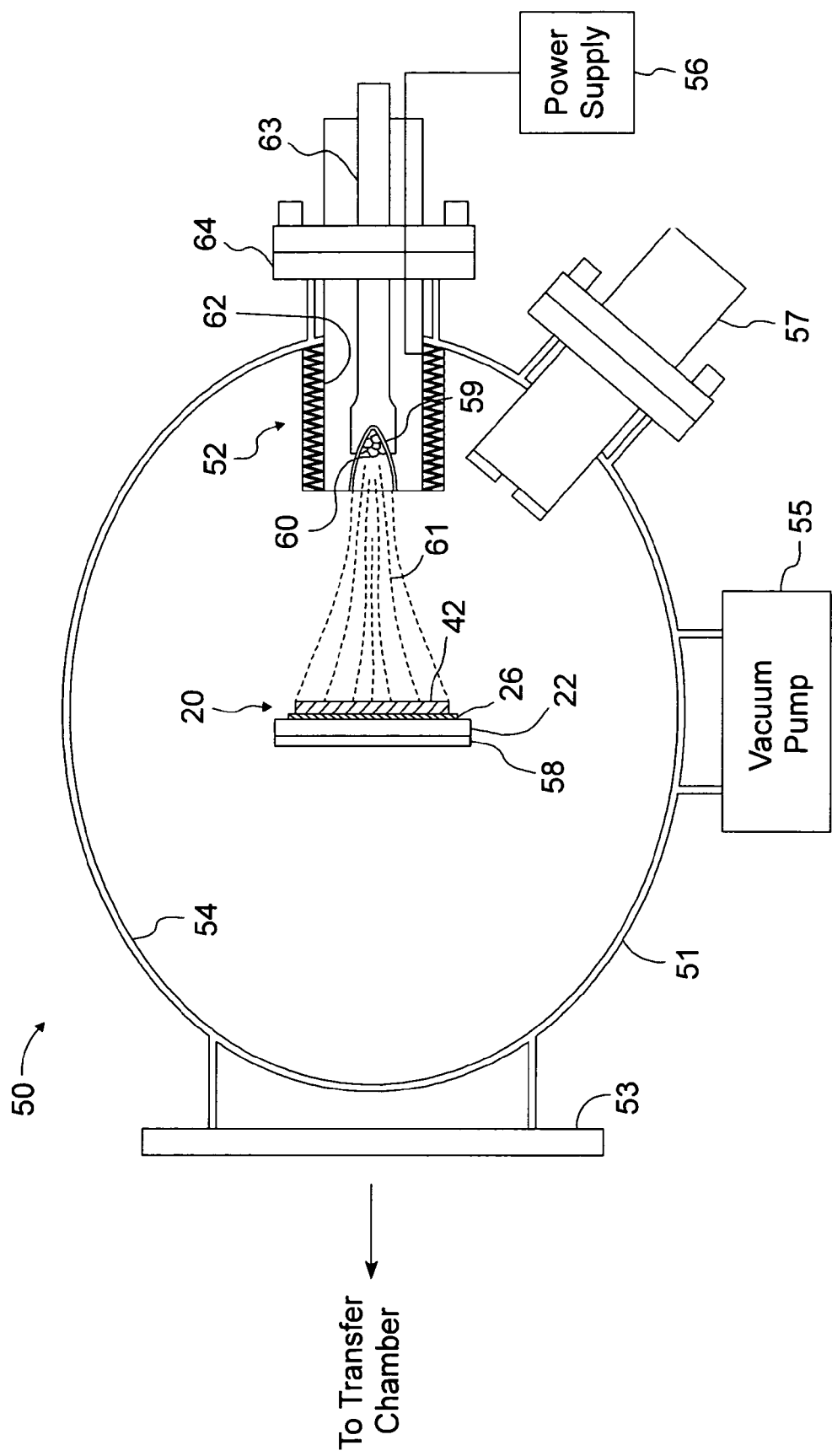
FIG. 9B is a schematic diagram of a deposition system capable of depositing the alkali halide layer of the photocathode.

Thereafter, the specimen is coated with an alkali halide layer 42, such as CsBr, via for example, sublimation from a CsBr Knudsen cell, in ultra high vacuum. For example, the CsBr layer can be deposited in a thickness of less than about 1000 angstroms, and more typically less than 400 angstroms. The deposited alkali halide layer 42 covers the conductor 26 and the surface of the InGaN layer. As one example, which is provided to illustrate one way of fabricating the film and should not be used to limit the invention, the alkali halide layer 42 can be manufactured in a deposition system 50 that is illustrated in FIG. 9B. The deposition system 50 comprises a sublimation chamber 51 to deposit both a conductor 26 in the form of a film of conducting material, such as a metal film or grid; and the alkali halide layer 42 on the light permeable support 22. A transfer or analysis chamber (not shown) can also be used for post-deposition analysis of the photocathode 20. The support 22 is placed in the sublimation chamber 51, and effusion cells 52 are used to sublimate alkali halide material. Channels 53 are provided between the chambers to allow transfer of the support 22 between the chambers without exposure to the external atmosphere. The sublimation chamber 51 typically has stainless steel walls 54 and an ultra-high vacuum pump 55, such as an ion pump, to maintain an ultra-high vacuum of from about $10^{-8}$ to about $10^{-11}$ Torr. A liquid nitrogen shrouding can be used to provide cold surfaces within the sublimation chamber 51 to reduce unwanted contaminants. The support 22 is mounted on a holder 58, which is maintained at a selected temperature for film growth by a power supply 56. A temperature instrument (not shown) may also be provided. An optical pyrometer or thermocouple can be used to measure the temperature of the support 22.

The effusion cell 52 also has a crucible 59 for sublimating alkali halide material 60 placed therein. The crucible 59 is made of a high temperature material, such as ceramic, graphite, tantalum, molybdenum, or pyrolytic boron nitride. The crucible 59 is secured to a frame 63 connected to a flange 64 for attachment of the effusion cell 52 to the sublimation chamber 51. The sublimation chamber 51 is evacuated to form an ultra-high vacuum oxygen-free environment in which the effusion cell 52 can operate. A heating assembly 62 surrounding the crucible 59 heats the material 60 in the crucible 59 to control the sublimation of the source material 60 from solid to vapor form. For example, in one embodiment, the source material 60 is heated to a temperature of from about 60 to about 300° C. The evaporated molecules 61 generated by evaporation of the alkali halide material 60 in the crucible 59 deposits on the conductor film 26 to form an epitaxial film of alkali halide material 42. The alkali halide layer 42, such as CsBr, can for example, be formed in a thickness of less than about 1000 angstroms.

After deposition of the halide material 60 on the support 22, the deposited material is activated to form a hetero-junction electron emitter 24 having a reduced minimum electron emission energy level at its surface. In one activation method, the deposited alkali halide material is irradiated with a light such as ultra-violet light having a wavelength <300 nm, such as deep-ultraviolet light having a wavelength in the range of from about 190 to about 532 nm. A suitable light source for a hetero-junction electron emitter layer comprising CsBr is, for example, an argon-ion laser. The activation is performed by directing the argon-ion laser beam onto the deposited hetero-junction electron emitter 24, in vacuum, for a time period of from 120 to about 240 minutes. The activation can be performed insitu in an electron generating apparatus or the photocathode may be activated in a separate vacuum chamber and transferred to the operating chamber under vacuum. In the IR irridation step, a lower minimum electron emission energy level is achieved by the migration of alkali metal atoms to form residual color centers and a surface-capping layer having a higher alkali metal atom concentration.

An embodiment of an electron beam apparatus 100 having a photocathode with an activated hetero-junction electron emitter is illustrated in FIGS. 10 to 16. The apparatus generates multiple electron beams 37 that are scanned across a workpiece 105. The workpiece 105 can be a blank mask; a silicon wafer; a compound wafer; a printed circuit board (PCB); or a multichip module (MCM). In one embodiment, the electron beam pattern is imprinted in a mask comprising an electron-sensitive resist coating 115 on a workpiece 105 comprising glass or quartz, which is used in the fabrication of integrated circuits (IC). After exposing the workpiece mask to electron beams 37, the exposed resist layer 115 is developed to form a resist pattern on the mask. The embodiments of the apparatus 100 and workpiece 105 illustrated herein are examples, and should not be used to limit the scope of the invention, and the invention encompasses equivalent or alternative versions, as would be apparent to one of ordinary skill in the art.

Figure 10:
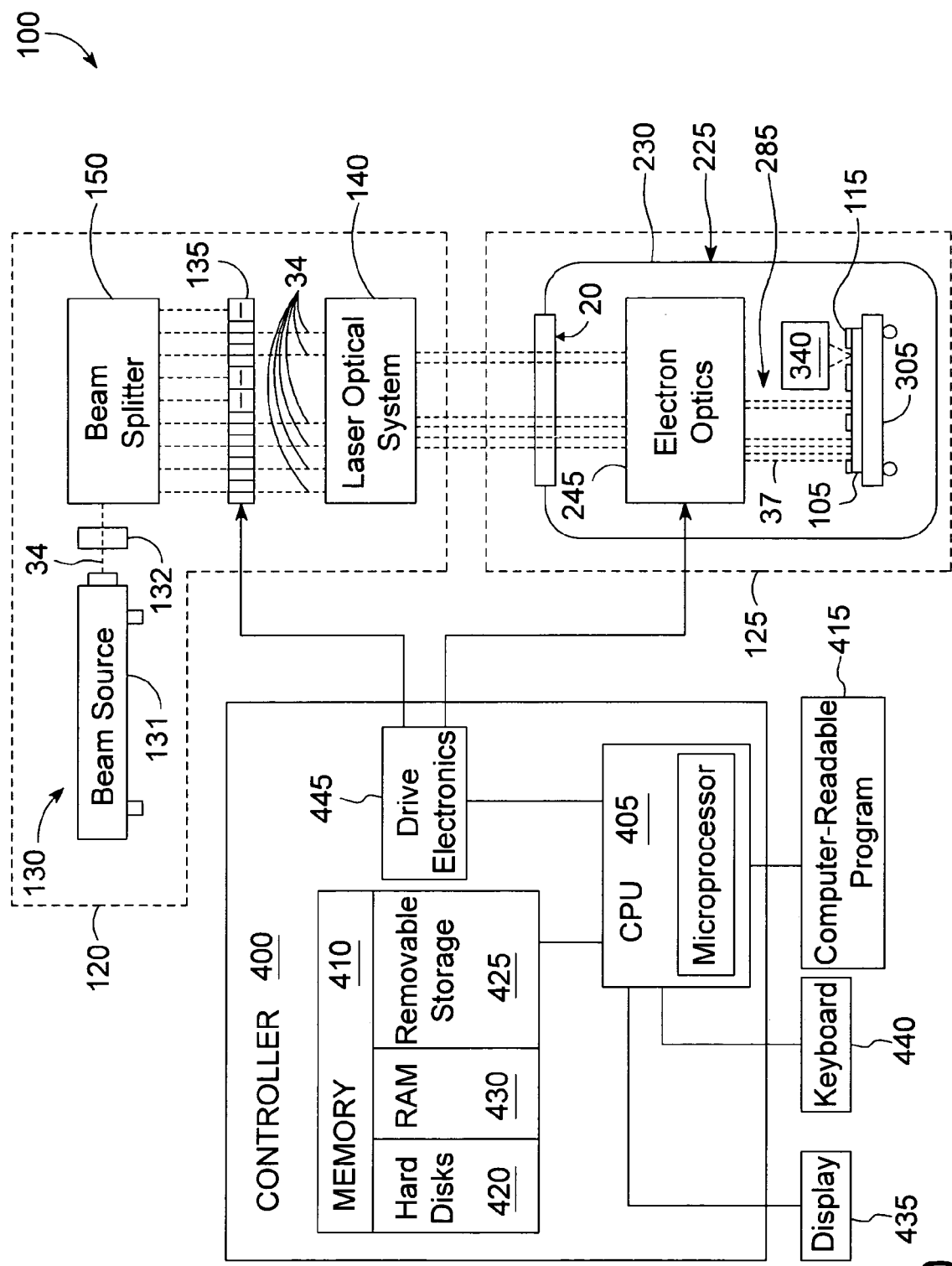
FIG. 10 is a schematic diagram of an embodiment of an electron beam apparatus having a photon source section, electron source section, and controller.
Figure 11:
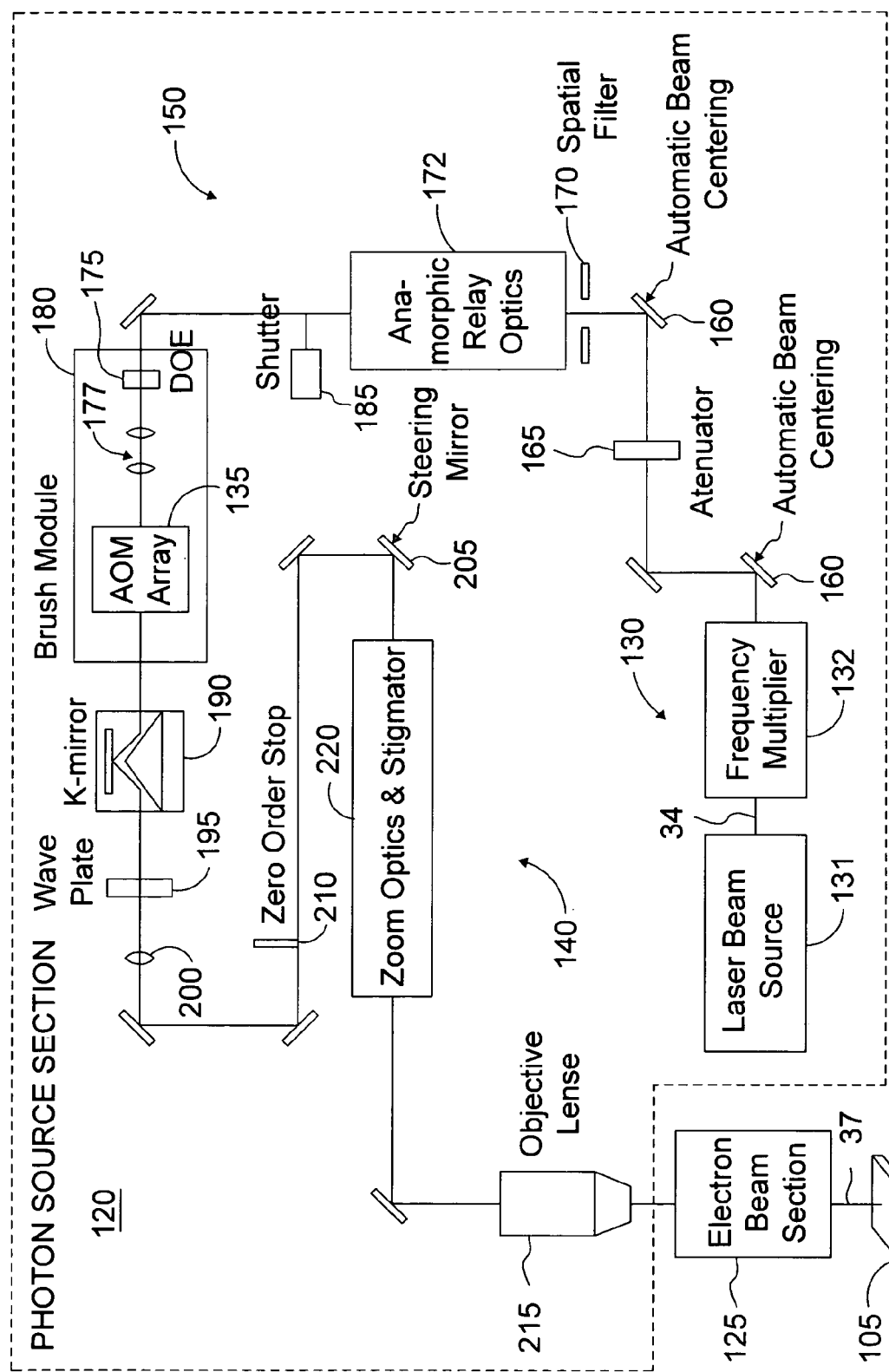
FIG. 11 is a schematic diagram of an embodiment of a photon source section of the electron beam apparatus of FIG. 10.

The electron beam apparatus 100 includes a photon source section 120 coupled to an electron beam section 125, as shown in FIG. 10. The photon source section 120, as illustrated in FIG. 11, may include a beam source 130, a beam modulator 135, optical system 140, and beam splitter 150. In one version, the beam source 130 comprises a laser 131, such as an argon ion laser. The beam source 130 may also comprise a frequency multiplier 132 to increase the frequency of the light beam 34 emitted by the laser 131. For example, the frequency multiplier 132 may comprise a beta barium borate (BBO) crystal that approximately doubles the frequency of the light beam 34. For an argon-ion produced laser beam having a fundamental wavelength of about 514 nm, a BBO crystal can receive the laser beam and double its frequency; in other words, halve its wavelength to about 257 nm. Alternatively, the beam source 130 may also comprise a frequency doubled diode-pumped laser source. In one example, the diode-pumped laser source operates at a fundamental wavelength of about 532 nm; however, a laser having a wavelength of 364 nm can also be used. Generally, the laser provides a laser beam with a wavelength of at least about 200 nm. The wavelength of the laser light is selected to cause absorption of light in the photocathode which has wavelengths above the bandgap energies of 2.8 eV with an absorption coefficient of at least about $10^5$ cm$^{-1}$ above threshold. The laser beam can have a power level that is sufficiently low that the electron voltage generated in the photocathode is lower than about 1 Mega-Volt/cm. This can be done by directing a laser beam at a power density <1 Mega-Watt/cm$^2$ onto the photocathode.

In operation, a light beam 34 generated by the laser 131 is split by a beam splitter 150 into an array of spaced apart individual light beams as shown. The light beam array 34' is then directed to a beam modulator 135 that modulates the intensities of each of the beams 34'. For example, the beam modulator 135 may comprise an array of acousto-optic modulators (AOM), which switch the beams 34' on or off by acoustically diffracting the beams in response to an RF signal, or set the transmitted photon flux of each individual beam to a predetermined intermediate value. In one embodiment, the light beam 34 is split by a beam splitter 150 into a light beam array 34' comprising 32 individual beams, and a beam modulator 135 comprising a matching number of 32 AOM beam modulator elements is used to modulate the split beams. In an AOM array, the modulation of the photon intensity is achieved by applying RF power to the individual AOM channels. Applying different levels of RF power can be used for fine modulation of the light intensity. In another embodiment, the beam modulator 135 comprises a spatial light modulator (SLM) such as a micromechanical diffracting device. SLMs can be advantageous because they can modulate a larger number of laser beams, such as at least about 100 laser beams. A multiple gray level, multiple pass writing strategy may also be used, in beam modulation. Furthermore, another beam modulator (not shown) may be inserted in the optical system upstream of the beam splitter 150 to act as a fast auxiliary blanker. This additional beam modulator may be used during scan retrace when additional modulation is needed. In one illustrative embodiment, a 300 MHz carrier frequency is used to diffract the laser beams with an approximately 10 nsec pixel time.

The beam splitter 150 may include optical light lenses focused on a desired plane of the electron beam section 125. The light beam 34 from the light beam source 130 may also be actively controlled by automatic beam centering mirrors 160 so that alignment to the optical train, both in position and angle, is maintained. An attenuator 165, which may comprise a combination polarization-rotating element and polarizing beam splitter, adjusts the laser power to a range suitable for operation of the system while allowing the beam source 130 to operate in a power range optimized for reliability and stability. A spatial filter 170 can remove undesirable sections of the laser beams intensity profile. An anamorphic relay 172 can be provided to create a round beam exiting this aperture and relay it to the diffractive optical element (DOE) 175 inside a brush module 180. The DOE 175 is a grating that produces a plurality of light beams 34'. The array of light beams 34' are focused by lenses of the brush module 180 to a region typically underneath the additional beam modulator. A mechanical shutter 185 before the brush module 180 is used to block light from reaching the electron beam section 125 when the electron beam apparatus 100 is not exposing the workpiece 105.

The individual modulated light beams 34 are demagnified by the optical system 140. A K-mirror 190 allows for rotational adjustment of the linear array of light beams 34' exiting the additional beam modulator. A wave plate 195 aligns the polarization of the beams for optimal focusing through birefringent supports such as sapphire. A lens element 200 after the wave plate 195 focuses the laser beam array onto a focal spot on a steering mirror 205. Before reaching the steering mirror 205, the zero-order (undiffracted) light from the beam modulator 135 is blocked by a zero-order beam stop 210. The steering mirror 205 allows for small positional adjustment of the spot array at the final image plane of an objective lens 215. The zoom optics and stigmator 220 relay the focal spot into the pupil of the objective lens 215. Tilted plates inside the zoom optics and stigmator 220 provide adjustment capability to ensure that the focus of the spots onto the electron beam section 125 occurs in the same plane whether measured along the direction of the array of spots or perpendicular to it. Movable lenses within the zoom optics and stigmator 220 allow for slight magnification adjustment of the array of light beams 34'.

Figure 12:
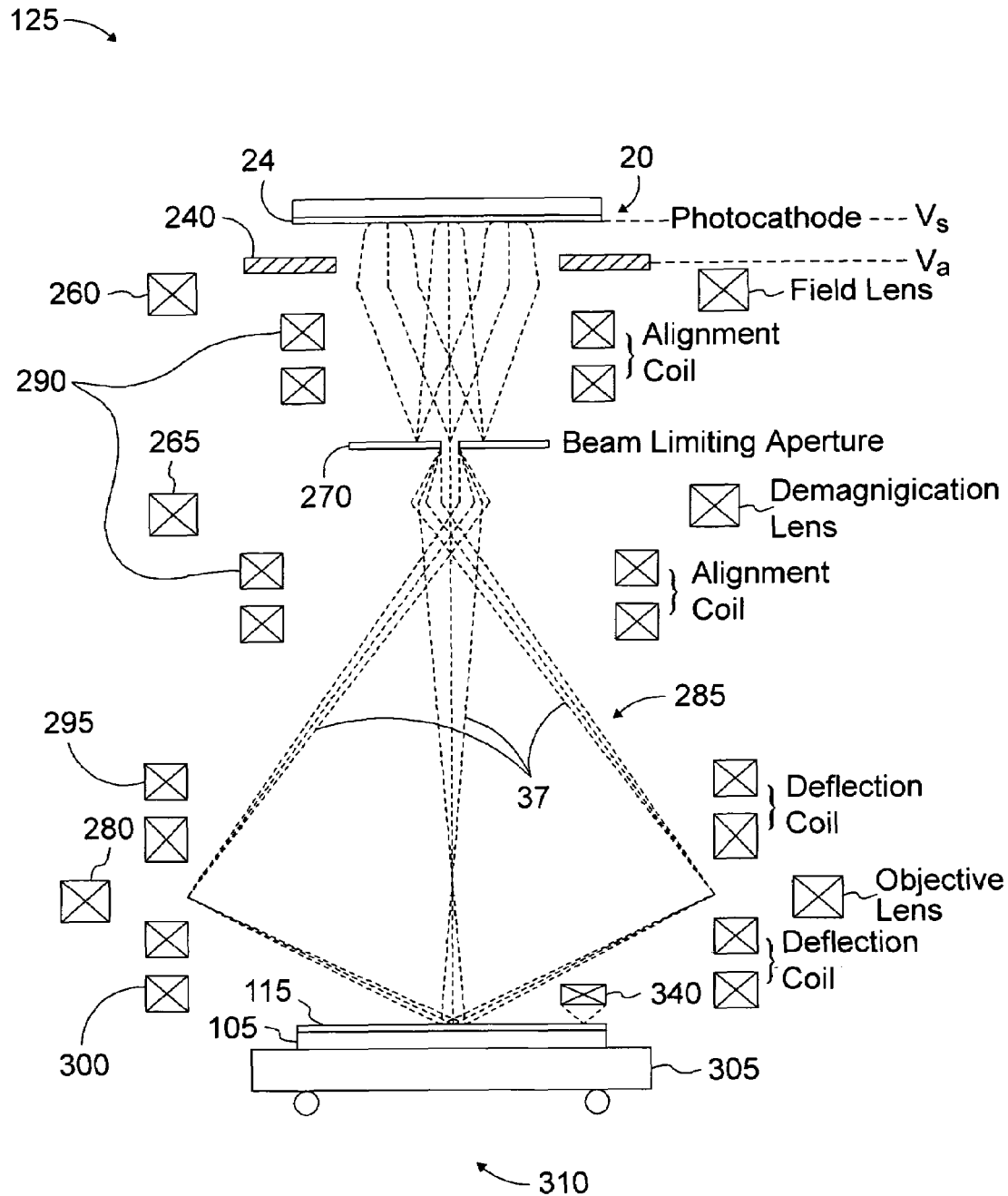
FIG. 12 is a sectional side view of an electron source section of the electron beam apparatus of FIG. 10.

Referring to FIGS. 11 and 12, below the photon source section 120, the electron beam section 125 converts the photon beam image generated by the photon source section 120 into a corresponding electron beam image. The electron beam section 125 may comprise a vacuum column 225 containing a vacuum environment in which electron beams 37 can be generated to expose the workpiece 105 to an electron beam image. The vacuum column 225 comprises walls 230 that are substantially vacuum-tight and are typically made of a material such as aluminum. One or more vacuum pumps (not shown) are provided to evacuate the vacuum column 225 to create and maintain the vacuum environment. In one embodiment, the vacuum pumps provide a first vacuum environment at the top portion of the vacuum column 225, and a second vacuum environment, which may have a different vacuum pressure at the bottom portion of the vacuum column 225. For example, the first vacuum environment may be at a gas pressure of about $10^{-9}$ Torr and the second vacuum environment may be at a gas pressure of about $10^{-6}$ Torr. A pressure barrier may also be provided between the vacuum environments to maintain the pressure difference.

The electron beam section 125 includes a photocathode 20 comprising the hetero-junction electron emitter 24, and electron beam elements such as an anode 240 and electron optics 245. During installation of the photocathode 20 in the electron beam apparatus 100, the photocathode 20 may be transferred within a continuous vacuum environment into the electron beam section 125. In operation, the optical system 140 focuses the array of light beams 34' exiting the beam modulator 135 onto a photocathode 20. The photocathode 20 receives the laser beam image and generates corresponding multiple electron beams 37 that form an electron beam image.

The photocathode 20 forms an extraction field between itself and the anode 240 to draw the electron beams 37 from the photocathode 20 and accelerate the electron beams 37 toward the workpiece 105. For example, the extraction field may have a strength of from about 5 to about 10 kV/mm. The electrons are accelerated to an initial energy level to form defined electron beams 37. The energy level is selected to be sufficiently high to substantially prevent interactions between the electron beams 37. When the electron beams 37 are moving vertically at a higher velocity, lateral interactions between the electron beams 37 are typically less significant than when the electron beams 37 are moving at lower velocities. In one embodiment, the electron beams 37 are accelerated to energies of from 1 keV to about 60 keV, such as about 50 keV. The electron beams 37 may have a brush width of from about 40 to about 90 microns, such as about 65 microns. Each electron beam 37 has a width of from about 270 to about 330 nm. When a voltage is applied to the anode 240, the electrons are accelerated and focused to form a multibeam virtual electron image of the photocathode emission surface corresponding to the laser beam image generated by the laser beam source 131. In one embodiment, the photocathode 20 is biased at about −50 kV, and is separated from a grounded anode 240 by an accelerating gap. The anode 240 is typically a planar electrode with an aperture in the center.

The electron optics 245 shape the electron beams 37 to focus, demagnify, stigmate, or align the electrons. Optionally, an electron field lens 260 near the photocathode 20 is used to reduce off-axis aberrations in demagnification lenses 265 that follow. A version of exemplary electron optics is described in commonly-assigned U.S. Pat. No. 6,215,128 by Mankos et al., entitled "Compact Photoemission Source, Field and Objective Lens Arrangement for High Throughput Electron Beam Lithography", filed on Mar. 18, 1999, which is hereby incorporated by reference in its entirety. The field lens 260 collimates the electrons exiting the accelerating region above the anode 240 and forms a crossover in the plane of a beam-limiting aperture 270. The virtual image created by the field lens 260 is then subsequently demagnified by the demagnification and objective magnetic lenses 265, 280 to form an array 285 of focused electron beams 37. Sets of alignment coils 290 are used to center and stigmate the electron beam array 285 in the beam-limiting aperture 270 and in the objective lens 280.

In one embodiment, a beam scanner 295 comprising a set of magnetic beam deflection coils is used to scan the array 285 of individually modulated electron beams 37 across the workpiece 105. Another set of magnetic deflection coils 300 performs dynamic stigmation and focus as the electron beam array 285 is scanned across a field of the workpiece 105. This allows dynamic stigmation, focus, or x/y deflection corrections to be applied to different parts of the scan field.

The electron beam pathway traversed by the electron beams 37 can be along a straight pathway, a curved pathway, or a series of redirected pathways. Thus, the apparatus components may be vertically oriented in a column above the workpiece 105, or oriented in an angled configuration (not shown), such as a right-angled configuration, or may be oriented in a curved configuration (also not shown).

The electron beam apparatus 100 further comprises a workpiece support 305 capable of supporting the workpiece 105. The support 305 may comprise an electrostatic chuck (not shown) capable of holding the workpiece 105 against the support 305. The electron bean generator 100 may also comprise support motors capable of moving the support 305 to precisely position the workpiece 105 in relation to the electron optics 245 or to move the workpiece 105 to scan the electron beams 37 across the workpiece 105. For example, the support motors may comprise electric motors that translate the support 305 in the x and y directions along an x-y plane parallel to the workpiece surface, rotate the support 305, elevate or lower the support 305, or tilt the support 305. The electron beam apparatus 100 may further comprise support position sensors capable of precisely determining the position of the support 305. For example, the support position sensors may reflect a light beam (not shown) from the support 305 and detect the intensity of the reflected beam, where interferometric analysis indicates the distance between the workpiece support 305 and the support position sensors.

When generating a pattern in an electron-sensitive resist 115 of a workpiece 105, exposure throughput refers to the area of the pattern exposed on the workpiece 105 per unit time, and determines the speed of pattern generation. A first factor affecting throughput is the total current needed to generate the pattern. A certain fraction of the electron-sensitive resist 115 is to be exposed. To a first approximation, this exposure occurs after a particular electron dose, which can be calculated for a resist 115 of given sensitivity. The throughput is determined by the time required to deliver this dose, which is proportional to the maximum total electron current. This total current is proportional to the number of electron beams $N_b$ and the current $I_b$ delivered by each electron beam 37 of the array 285. Thus the time ô to expose a given area is $ô = AS/N_b I_b$, where A is the area to be patterned and S is the resist sensitivity (charge density required to expose the resist). High throughput can be achieved by using a sufficiently large number of electron beams 37 and a sufficiently large current in each electron beam 37.

The electron beam apparatus 100 further comprises a controller 400 comprising a suitable configuration of hardware and software, as for example shown in FIG. 10, to operate the components of the electron beam apparatus 100 to generate an electron beam pattern on the workpiece 105. For example, the controller 400 may comprise a central processing unit 405 (CPU) that is connected to a memory 410 and other components. The CPU 405 comprises a microprocessor, such as a complex instruction set computer (CISC) microprocessor, for example a Pentium™ microprocessor commercially available from Intel Corporation, Santa Clara, Calif., or a reduced instruction set computer (RISC) microprocessor, capable of executing a computer-readable program 415. The memory 410 may comprise a computer-readable medium such as hard disks 420 in a redundant array of independent disks (RAID) configuration, removable storage 425 such as an optical compact disc (CD) or floppy disk, random access memory 430 (RAM), and/or other types of volatile or non-volatile memory. The interface between a human operator and the controller 400 can be, for example, via a display 435, such as a cathode ray tube (CRT) monitor, and an input device, such as a keyboard 440. The controller 400 may also include drive electronics 445 such as analog and digital input/output boards, linear motor driver boards, or stepper motor controller boards. The drive electronics 445 function as an interface between the controller 400 and the various other subsystems of the and thus can contain specialized hardware modules to facilitate functioning of the controller 400. The hardware modules are removable and may be periodically exchanged for updated modules.

Figure 13:
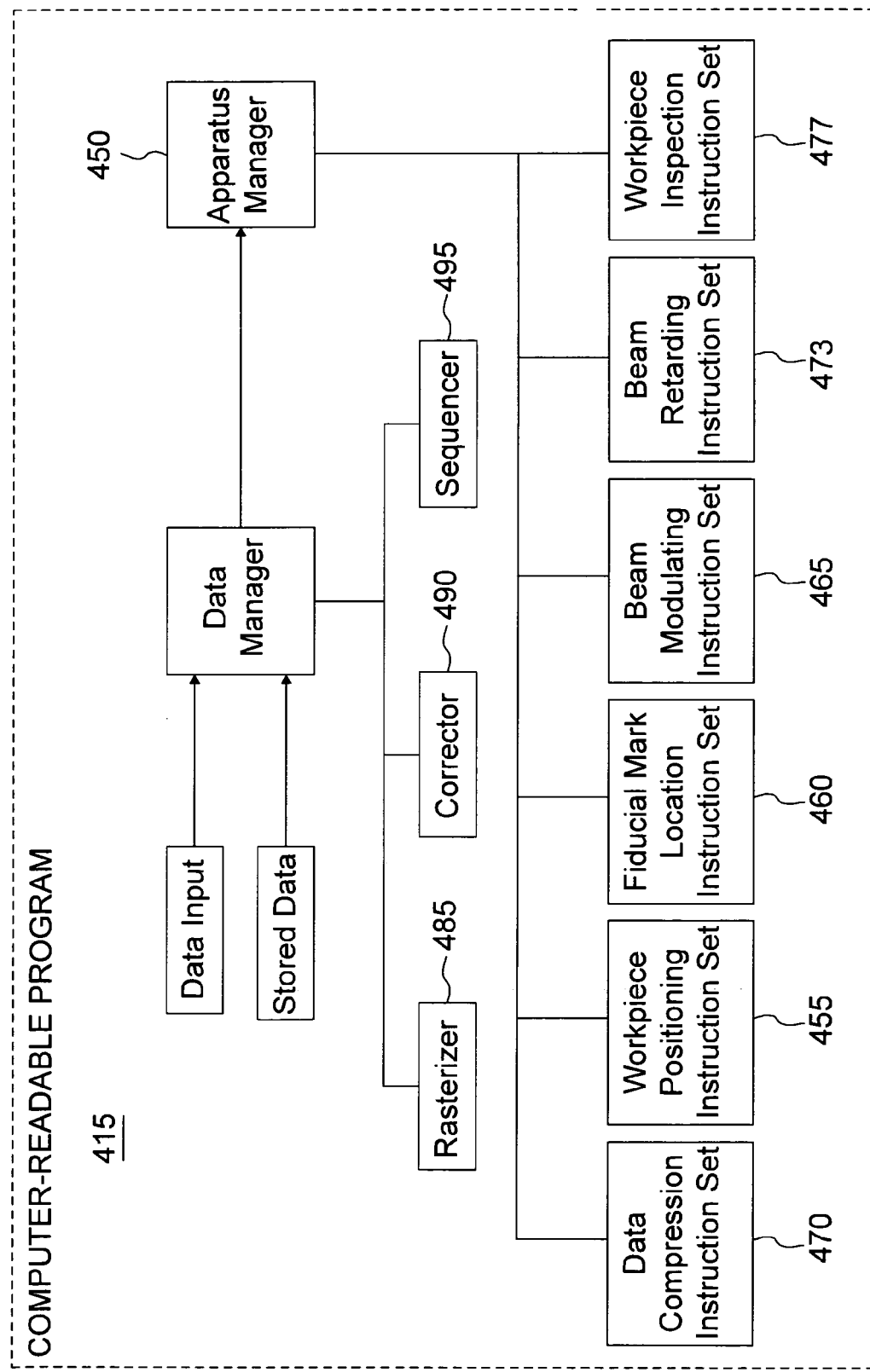
FIG. 13 is a schematic diagram of an embodiment of a computer-readable program executable by the controller shown in FIG. 10.

The computer-readable program 415 generally comprises software comprising sets of instructions to operate the apparatus components, and an apparatus manager 450 to manage the instruction sets, as illustrated in FIG. 13. The computer-readable program 415 can be written in any conventional programming language, such as for example, assembly language, C, C++ or Pascal. Suitable program code is entered into a single file, or multiple files, using a conventional text editor and stored or embodied in the memory 410 of the controller 400. If the entered code text is in a high level language, the code is compiled, and the resultant compiler code is then linked with an object code of pre-compiled library routines. To execute the linked, compiled object code, the user invokes the feature code, causing the CPU 405 to read and execute the code to perform the tasks identified in the computer-readable program 415. Using a keyboard interface, a human user enters commands or registration parameters into the computer-readable program 415 in response to menus or screens displayed on the display 435. The computer-readable program 415 may include instruction sets to, for example, control the positioning of the workpiece support 305 (instruction set 455), locate fiducial marks on the workpiece 105 (instruction set 460), control beam modulation (instruction set 465), control data compression (instruction set 470), and control the retarding of the electron beams 37 (instruction set 473). If the electron beam apparatus 100 is used to inspect the workpiece 105, the computer-readable program 415 may further comprise an instruction set to evaluate a signal from the detectors 342 to generate a pattern representative of the structure of the workpiece 105 (instruction set 477). This workpiece inspection instruction set 477 may also comprise program code to determine a property of the workpiece 105, such as a defect or critical dimension, from the evaluated signals. The instruction sets may receive parameters, such as a data file corresponding to the support position, the fiducial mark locations, the electron beam pattern, properties of the workpiece 105, or instructions entered by the human operator.

The controller 400 is adapted to generate, send, and receive signals to operate the apparatus components to generate a pattern by directing electron beams 37 onto the workpiece 105. For example, the controller 400 may send signals to the beam modulator 135 to control modulation of the electron beams 37 to the desired intensity levels, such as in correspondence to electron beam pattern data to write a corresponding pattern on the workpiece 105. The beam modulator 135 may also be controlled to scale the electron beam pattern in the scanning direction by timing the beam pulses, and the support motors may also receive real-time instructions from the controller 400 to control the position of the workpiece 105 to scale, rotate, or offset the pattern generated by the electron beams 37. As another example, the controller 400 may also operate a fiducial mark locator 340 by receiving measured locations of fiducial marks on the workpiece 105 and comparing them to intended locations to determine the deviation of each fiducial mark, thereby calculating the position of the workpiece 105.

Figure 14:
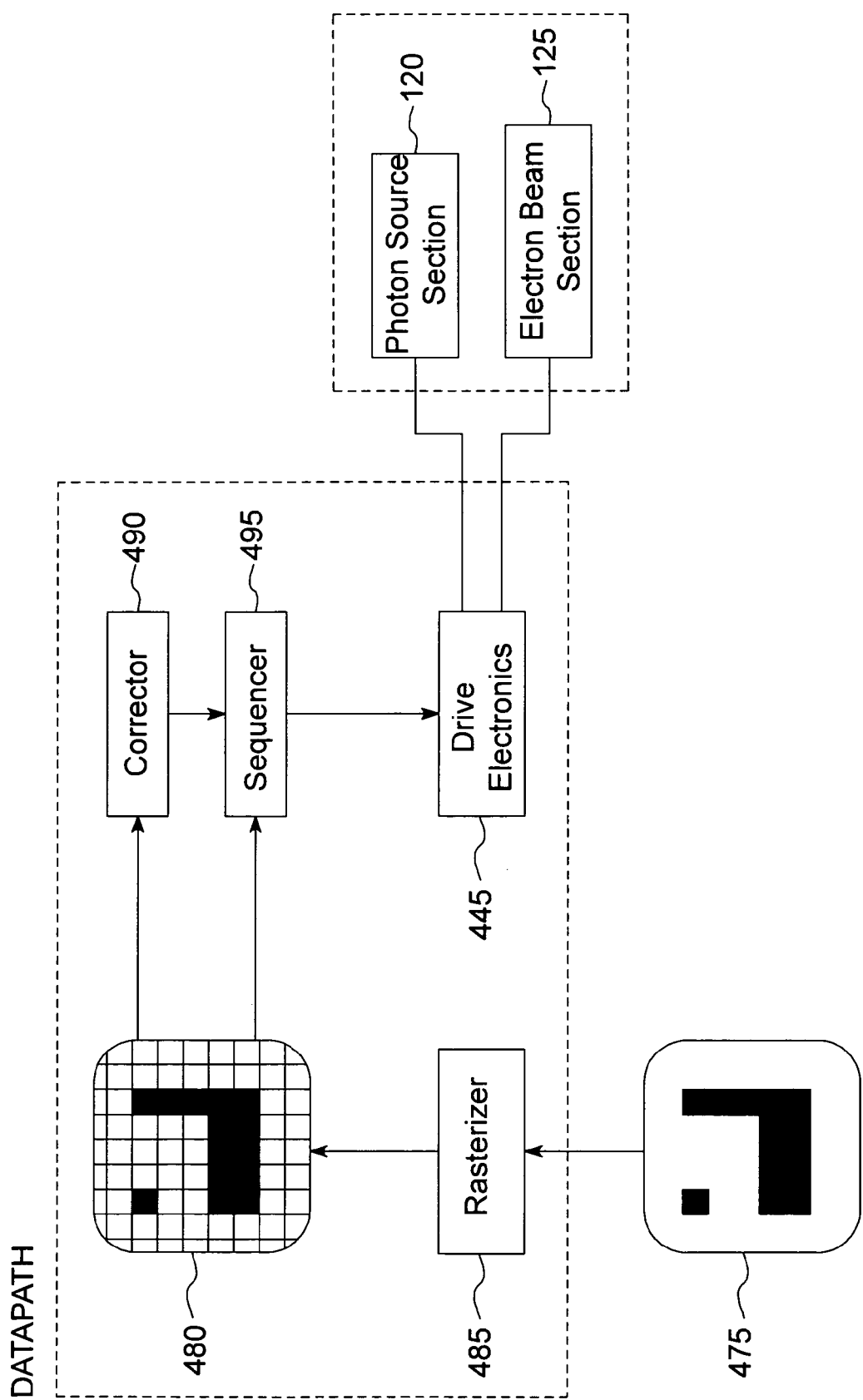
FIG. 14 is a block diagram of an embodiment of a data path for generating a raster scanning data pattern.

The controller 400 may control the beam modulator 135 and beam scanner 295 of the electron beam apparatus 100 to scan the electron beams 37 across the workpiece 105 according to a raster method, or alternatively according to a vector method. Depending on the scanning method used in generating a pattern on the workpiece 105, pattern data that are stored in the memory 410 and communicated to the beam modulator 135 are also different. FIG. 14 is a block diagram showing a data processing path for a raster scanned electron pattern. In a raster method, the pattern data 475 are processed into a bitmap 480 by a rasterizer 485 and the bitmap 480 is stored in the memory 410. An exemplary rasterizer 485 is described in commonly-assigned U.S. Pat. No. 5,533,170 by Teitzel et al., entitled "Rasterizer for a Pattern Generation Apparatus", filed on Nov. 22, 1994, which is hereby incorporated by reference in its entirety. Thereafter, a corrector 490 corrects the bitmap to compensate for proximity effects, heating effects, or other undesirable effects. A sequencer 495 then sequences the corrections to apply to the sequenced bitmap to modulate the electron beams 37. Control of pixel dosage is determined by the modulation of the electron beams 37 as a function of time. The electron beams 37 are scanned across the workpiece 105 in a substantially predetermined sequence of parallel scan lines to generate the pattern on the workpiece 105.

In a vector scanning method, in contrast, the pattern data are stored as vectors. For example, data corresponding to a line can be stored as a vector comprising a starting position, a length, and a direction. Additionally, certain other shapes may be stored in a way that refers to the characteristic dimensions of the shapes. The electron beams 37 are scanned across the workpiece 105 along paths that correspond to the pattern vectors. For example, to draw a line, the beam scanner 295 could deflect an electron beam 37 to the starting position in a first step, the beam modulator 135 turns on the electron beam 37 in a second step, the beam scanner 295 deflects the turned-on electron beam 37 through the length of the line in a third step, and the beam modulator 135 turns off the electron beam 37 in a fourth step.

Typically, the electron beams 37 are spatially distributed such that optical interference and other crosstalk between them are reduced or eliminated. However, typically a final exposed pattern in the resist layer 115 produced by raster scanning is composed of overlapping spots, which can be accomplished by employing an interlaced scan print strategy and writing with multiple passes. The controller 400 may contain pattern data in the memory 410 in either flat or hierarchical formats. The flat formats contain the pattern information in a raw form that is not organized by hierarchy or otherwise compressed. In contrast, the hierarchical formats contain the pattern information in a compressed hierarchical organization that expedites transmission from the memory 410 to the beam modulator 135.

Figure 15:
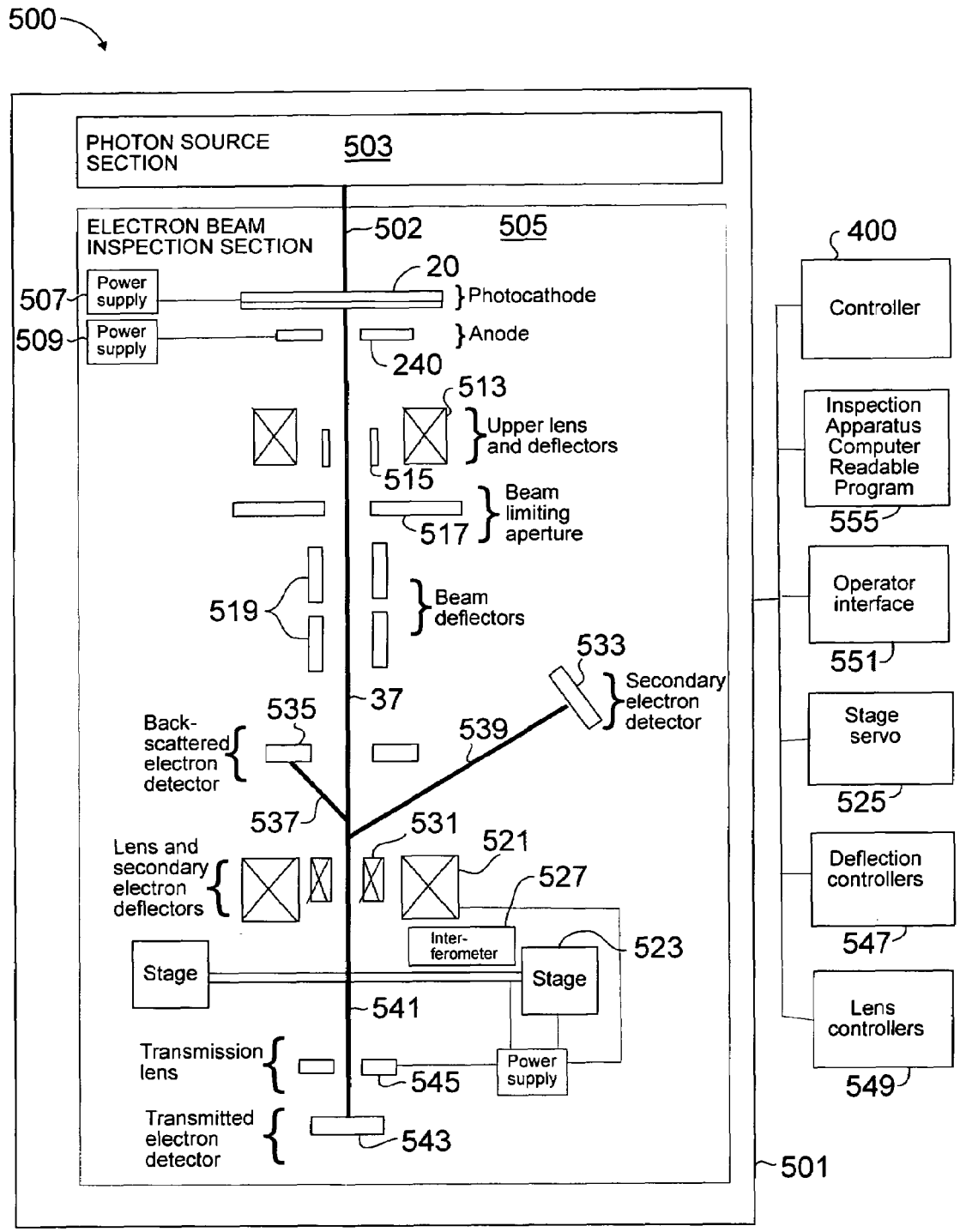
FIG. 15 is a schematic diagram of an embodiment of an embodiment of an electron beam inspection apparatus.

An exemplary embodiment of an electron beam inspection apparatus 500 is schematically illustrated in FIG. 15. The illustration is provided as an exemplary embodiment and should not be used to limit scope of the invention or this embodiment. Generally, the apparatus 500 directs electron beam 37 toward a substrate 105 and subsequently detects back-scattered electrons 537, secondary electrons 539, and transmitted electrons 541. The detected electrons can be used to generate an image representative of the substrate 105. For example, electron beams reflected from the substrate 105 can be used to determine a surface topography of the substrate 105, or electrons can be transmitted through the substrate 105 to determine an internal composition of the substrate 105 or to irradiate the substrate 105. Any electron generated image can be used to determine properties of the substrate 105, such as to accurately locate defects, measure dimensions of features of the substrate 105, or measure distances between two or more points on the substrate 105. For example, after manufacturing, a substrate 105 can be inspected to determine whether critical dimensions of features formed on the substrate are within a preselected tolerance range or are properly shaped. The electron beam inspection apparatus 500 is capable of inspecting semiconductor substrates, X-ray masks and other conductive substrates. The apparatus 500 can also be used in various modes of operation, for example, images from two sections of the same substrate 105 can be compared with each other, or the image from the substrate 105 can be compared with an image from a database that represents the design goal.

The electron beam inspection apparatus 500 comprises enclosing walls 501 to contain a vacuum environment generated by vacuum pumps (not shown). The apparatus 500 comprises a photon source section 503 and an electron beam inspection section 505. The photon source section 503 produces and delivers a single beam or multiple, independently-controllable light beams 502 to the electron beam inspection section 505. The section 503 may comprise the photon source section 120 from the apparatus 100 as previously discussed, or other photon sources, such as a lamp that produces photons with energies above at least about 3 eV.

Disposed below the photon source section 503 is the electron beam inspection section 505, comprising a photocathode 20 to receive the light beam 502 and generate an electron beam 37. The photocathode 20 comprises an activated alkali halide material that emits electrons when excited with light as described. Power supplies 507, 509 deliver bias conditions to the photocathode 20 and the anode 240 to form an extraction field between the photocathode 20 and the anode 240. For example, the extraction field may have a strength of from about 0.1 to 5 kV/mm. In one embodiment, the photocathode 20 is biased at about 1 kV. The anode 240 is typically a planar electrode with an aperture in the center.

The electron beam inspection section 505 also comprises electron optics to focus, control, deflect, and otherwise shape the electron beam 37 emitted by the photocathode 20, which is also referred to as the primary beam 34. An upper lens 513 may be disposed below the photocathode 20 and anode 240 to collimate the electron beam 37. An upper deflector 515 may also be optionally disposed near the upper lens 513 for alignment, stigmation, and blanking of the electron beam 37. The upper deflector 515 may be, for example, an electrostatic deflector. A beam limiting aperture 517 is disposed below the upper lens 513 and upper deflectors 515 to provide further beam shaping and comprises several holes. A pair of electrostatic beam deflectors 519 are disposed below the beam limiting aperture 517 to control the deflection of the beam 34 as it scans the substrate 105. The beam deflectors 519 may also be used to control the incident primary beam 34 such that interference with other electrons generated by the incidence of the primary beam 34 on the substrate 105 are minimized. A lens 521 is disposed below the beam deflectors 519 to refocus the electron beam 37.

The substrate 105 to be inspected is held and positioned by an x-y stage 523 disposed below the lens 521. The stage 523 is controlled by a stage servo 525. Interferometers 527 disposed about the stage 523 and substrate 105 are used for positioning and alignment of the substrate 105. Communication between the stage 523, stage servo 525, and the interferometers 527 is performed by a controller 400 as previously described.

The electron beam inspection apparatus 500 can detect one or more of secondary 539, back-scattered 537, and transmission electrons 541. To detect secondary electrons 539, the apparatus 500 comprises secondary electron deflectors 531 and a secondary electron detector 533. The secondary electron deflector 531 is disposed near the lens 521 and is capable of deflecting secondary electrons 539 to the secondary electron detector 533 based on their energy levels. In one version, the secondary electron deflector 531 comprises a Wien filter that only allows charged particles having a threshold energy to pass uninhibited and deflects the path of particles at other energies. The Wien filter is tuned to the incident primary electron beam energy to deflect the lower energy secondary electrons 539. The secondary electron detector 533 receives deflected secondary electrons 539, and may be a reverse biased high frequency Schottky barrier detector. Other types of semiconductor detectors may also be used. The stage 523, substrate 105, and portions of the lens 521 may be biased in such a way as to increase the energy levels of secondary electrons 539 to allow their efficient collection, and bias conditions are coordinated with the tuning of the Wien filter.

The back-scattered electron detector 535 is disposed annularly about, and above the lens 521, and comprises a hole in the center to allow passage of the primary electron beam 37. Back-scattered electrons 537 typically have a higher energy than secondary electrons 539, and may be further accelerated by bias conditions on the stage 523, substrate 105, and lens 521, to allow them to pass relatively uninhibited by the secondary electron deflector 531. The apparatus 500 may also be operated such that the secondary electron deflector 531 is turned off and thus only back-scattered electrons 537 will be detected. The back-scattered electron detector 535 may be a Schottkey barrier detector similar to other detectors, but with the above mentioned hole in the center.

To allow inspection of partially transparent substrates, a transmission electron detector 543 is located below the stage 523. A transmission lens 545 is disposed below the stage 523 and above the transmission electron detector 543. The transmission electrostatic lens 545 is used to spread the transmitted electron beam 541 to a diameter suitable for detection by the transmitted electron detector 543, which may also be a Schottky barrier detector.

Referring to FIGS. 15 and 16, the controller 400 coordinates the operation of the apparatus 500 and its subsystems, which include deflection controllers 547, the stage servo 525, lens controllers 549, an inspection apparatus computer readable program 555, and an operator interface 551. The deflection controllers 547 control the operation of the various beam deflectors. The inspection apparatus computer readable program 555 includes instruction sets that the system controller 529 may use to operate the apparatus 500. The instruction sets comprise image analysis instructions 557, deflection controller instructions 559, stage servo instructions 561, and lens controller instructions 563. The image analysis instructions 557 comprise image database instructions 565, image comparison instructions 567, image processing instructions 569. The image analysis instruction sets 557 include instructions for such purposes as storing image scan data, reading and retrieving image data from a database, comparing scanned image data with images from the image database or other scanned data, and high level image processing algorithms. The operator interface 551 comprises at least a keyboard 440 and a display 435 and relays information to a human operator and accepts commands. The interface 551 may also comprise other input and output devices such as a mouse, floppy disk drive, compact disc drive, and a printer (all not shown).

During operation of the apparatus, the substrate 105 to be inspected is placed beneath the electron beam 37 on the x-y stage 523. Alignment of the substrate 105 is achieved by scanning the substrate 105 with the electron beam 37 and observing the image on the display 435. The apparatus 500 then directs an electron beam 37 at the substrate 105 and detects secondary electrons 539 generated by the beam 34, the back-scattered electrons 537 from the beam 34 and transmitted electrons 541 which pass through the substrate 105. Data collection and analysis of the scan is performed by the system controller 529 and the inspection apparatus computer readable program 555. The position and movement of the stage 523 during the inspection of the substrate 105 is controlled by the stage servo 525, interferometers 527, and the system controller 529.

When comparing the substrate 105 to a database image, data from the scan is stored in the memory 410, and a comparison to the database image is performed by the system controller 529 using the image analysis instructions 557. Likewise, when comparing two sections of the same substrate 105, the stage servo 525 moves the stage 523 SO that the electron beam 37 alternately scans each section or subsections. The scan data of the first section or subsection is stored in the memory 410, and then this data, along with the scan data of the second section or subsection is processed by the system controller 529 and the image analysis instructions 557. Various defect detection algorithms may be implemented via the image analysis instructions 557, which may interpret the comparison of the image data according to algorithms. After the substrate 105 has been inspected, a list of defects, together with their locations, is displayed on the display 435 and the operator can then initiate a defect review via the keyboard 440. In response to operator commands, the apparatus 500 may locate and provide scans of the neighborhood of each defect and displays the image to the operator on the display 435.

Two important applications of the electron beam inspection apparatus 500 are the detection of small physical defects and the detection of defects buried well beneath the surface of the substrate 105. Detection of small physical defects is becoming increasingly difficult. Shrinking feature sizes and increasing aspect ratios are pushing inspection of substrates beyond the inherent limits of optical inspection. The electron beam inspection device 500 can typically achieve higher resolution and higher depth of field than optical inspection devices, making electron beam inspection an increasingly important tool for the processing of substrates.

Defects buried well beneath the surface of the substrate 105 are also an important application and are essentially invisible to optical devices. Voids in contact and via plugs can often be hidden beneath several layers of subsequently deposited material. Incomplete etch or excess polymer buildup during the formation of holes for contacts and vias are also a concern. Buried defects can be discovered by electron beam inspection even if the electron beam inspection apparatus 500 can not form a direct image of the area of concern. Buried defects can be identified using a technique known as voltage contrast. Upon illumination by an electron beam 37, a defective hole charges up differently than a non-defective hole. The bad hole either glows more or less, depending on image conditions, than the good ones do in the electron beam image. A defective plug can also be found this way. Upon illumination by the electron beam 37, the higher resistance of the defective plug causes it to glow either more or less brightly in the image, thus identifying itself.

Although the present invention has been described in considerable detail with regard to certain preferred versions thereof, other versions are possible. The present invention could be used with other electron beam apparatuses 100 or other equivalent configurations as would be apparent to one of ordinary skill in the art. For example, the electron beam apparatus 100 may generate a pattern by generating and modulating the electron beams 37 directly rather than in the photon source section 120. Also, the electron beam apparatus 100 may generate the electron beams 37 by illuminating the photocathode 20 with other electron beams from an electron beam source rather than with the light beams 34 from the photon source section 120. Thus, the appended claims should not be limited to the description of the preferred versions contained herein

What is claimed is:

1. A photocathode capable of generating an electron beam from incident light, the photocathode comprising:
   (a) a light permeable support having a light receiving surface and an opposing surface;
   (b) a Group III nitride layer on the opposing surface of the support, the Group III nitride layer comprising at least one Group III element and nitrogen; and
   (c) an alkali halide layer on the Group III nitride layer.

2. A photocathode according to claim 1 wherein the alkali halide layer comprises cesium halide.

3. A photocathode according to claim 2 wherein the cesium halide layer comprises cesium bromide or cesium iodide.

4. A photocathode according to claim 2 wherein the cesium halide layer comprises concentration gradient of cesium through the thickness of the layer.

5. A photocathode according to claim 1 wherein the Group III nitride layer comprises at least one of scandium, yttrium, lanthanum, actinium, boron, aluminum, gallium, indium and thallium.

6. A photocathode according to claim 1 wherein the Group III nitride layer comprises InGaN.

7. A photocathode according to claim 1 wherein the Group III nitride layer is selected to absorb light having wavelengths above bandgap energy levels, with typical absorption coefficients of at least about $10^5$ cm$^{-1}$ above threshold.

8. A photocathode according to claim 1 wherein the Group III nitride layer is selected to provide a breakdown voltage of at least about 1 Mega-Volt/cm.

9. A photocathode according to claim 1 wherein the Group III nitride layer is selected to receive a laser power density in the range of from about 0.1 to about 1 Mega-Watt/cm$^2$.

10. A photocathode according to claim 1 wherein Group III nitride layer is selected to generate a current density of greater than 100 A/cm$^2$.

11. An electron pattern generator comprising the photocathode of claim 1, the electron pattern generator comprising:
   (a) a light source to generate the light directed onto the light receiving surface of the photocathode;
   (b) electron optics to focus the electron emitted by the photocathode onto a substrate; and
   (c) a substrate support to support the substrate.

12. A method of generating an electron pattern the method comprising:
   (a) providing a photocathode comprising:
      (1) a light permeable support having a light receiving surface and an opposing surface;
      (2) a Group III nitride layer on the opposing surface of the support, the Group III nitride layer comprising at least one Group III element and nitrogen; and
      (3) an alkali halide layer on the Group III nitride layer;
   (b) directing light onto the light receiving surface of the support at a wavelength selected to cause electrons to be emitted from the photocathode;
   (c) modulating the light or emitted electrons according to a pattern to form a plurality of modulated electron beams; and
   (d) directing the modulated electron beams onto a surface of a substrate.

13. A method according to claim 12 wherein (b) comprises directing light at a wavelength selected to cause electrons to be emitted from both the Group III nitride layer and the cesium halide layer.

14. A method according to claim 12 wherein (b) comprises directing light at a wavelength selected to cause electrons to be emitted from both a Group III nitride layer comprising InGaN, and an alkali halide layer comprising cesium bromide or cesium iodide.

15. A method according to claim 12 wherein (b) comprises directing light comprising a laser beam having a wavelength of at least about 200 nm.

16. A method according to claim 12 wherein (b) comprises directing light having a wavelength that is selected to cause absorption of light which has wavelengths above the bandgap energies of 2.8 eV with an absorption coefficient of at least about $10^5$ cm$^{-1}$ above threshold.

17. A method according to claim 12 wherein (b) comprises directing light comprising a laser beam having a power level that is sufficiently low that the electron voltage generated in the photocathode is lower than about 1 Mega-Volt/cm.

18. A method according to claim 17 comprising directing a laser beam at a power density <1 Mega-Watt/cm$^2$.

19. A method according to claim 17 wherein (b) comprises directing a laser beam having a power level that is sufficiently high to generate a current density in the photocathode of at least about 100 A/cm$^2$.

20. A method of manufacturing the photocathode of claim 1, for an electron beam pattern generator, the method comprising:
   (a) providing a light permeable support in a process zone, the light permeable support having a light receiving surface and an opposing surface;
   (b) evacuating the process zone;
   (c) depositing a Group III nitride layer on the opposing surface of the support, the Group III nitride layer comprising at least one Group III element and nitrogen;
   (d) depositing an alkali halide layer by evaporation to form an alkali halide layer on the Group III nitride layer; and
   (e) activating the alkali halide layer by an energy source to generate a concentration gradient of alkali in the layer.

21. A method according to claim 20 comprising exposing the alkali halide layer to a light source at a sufficient energy level to cause alkali atoms to diffuse through the layer to form a concentration gradient of alkali through the thickness of the layer.

22. A method according to claim 20 comprising depositing an alkali halide layer comprising a cesium halide layer.

* * * * *